US012628514B2

(12) United States Patent
Zhang et al.

(10) Patent No.: US 12,628,514 B2
(45) Date of Patent: May 12, 2026

(54) DISPLAY SUBSTRATE, MANUFACTURING METHOD THEREFOR, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Yunpeng Zhang, Beijing (CN); Yucheng Chan, Beijing (CN); Chengchung Yang, Beijing (CN); Yangzhong Jing, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 404 days.

(21) Appl. No.: 18/033,366

(22) PCT Filed: Apr. 20, 2022

(86) PCT No.: PCT/CN2022/088012
§ 371 (c)(1),
(2) Date: Apr. 24, 2023

(87) PCT Pub. No.: WO2023/201591
PCT Pub. Date: Oct. 26, 2023

(65) Prior Publication Data
US 2024/0381713 A1     Nov. 14, 2024

(51) Int. Cl.
*H10K 59/131*     (2023.01)
*H10K 59/12*     (2023.01)
*H10K 59/124*     (2023.01)
*H10K 59/126*     (2023.01)
*H10K 77/10*     (2023.01)

(52) U.S. Cl.
CPC ....... *H10K 59/131* (2023.02); *H10K 59/1201* (2023.02); *H10K 59/124* (2023.02); *H10K 59/126* (2023.02); *H10K 77/111* (2023.02)

(58) Field of Classification Search
CPC .... H10K 59/126; H10K 59/131; H10K 59/82; H10K 2102/311; H10K 77/111; H10D 86/441; H10D 30/6723
See application file for complete search history.

(56) References Cited

U.S. PATENT DOCUMENTS

2018/0053905 A1*   2/2018   Lee ..................... H10K 59/126
2019/0244974 A1    8/2019   Chen
(Continued)

FOREIGN PATENT DOCUMENTS

CN          109148541 A      1/2019
CN          110034150 A      7/2019
(Continued)

OTHER PUBLICATIONS

Machine translation of CN-112885847-A (Year: 2021).*

*Primary Examiner* — Bryan R Junge
(74) *Attorney, Agent, or Firm* — Ling Wu; Stephen Yang; Ling and Yang Intellectual Property

(57) ABSTRACT
A display substrate, a manufacturing method therefor, and a display apparatus are disclosed. A display substrate includes a drive circuit layer disposed on a base substrate, the base substrate includes, at least, a first flexible layer, a second flexible layer and a base substrate conductive layer disposed between the first flexible layer and the second flexible layer. The base substrate conductive layer includes, at least, a first connection line, the drive circuit layer includes, at least, a shielding conductive layer and a functional conductive layer, wherein the shielding conductive layer includes, at least, a second connection line, and the functional conductive layer includes, at least, a function signal line. The second con- (Continued)

nection line is connected with the first connection line through the first lap via, and the function signal line is connected with the second connection line through the second lap via.

19 Claims, 15 Drawing Sheets

(56)                    References Cited

U.S. PATENT DOCUMENTS

| | | | |
|---|---|---|---|
| 2020/0174528 A1* | 6/2020 | Park | H10K 71/00 |
| 2020/0312886 A1* | 10/2020 | Yuan | H10D 86/441 |
| 2022/0005910 A1 | 1/2022 | Ming et al. | |
| 2022/0181354 A1* | 6/2022 | Lee | H10D 86/423 |
| 2022/0208950 A1* | 6/2022 | Park | H10K 59/18 |
| 2022/0285428 A1* | 9/2022 | Jo | H10H 20/851 |
| 2022/0293670 A1* | 9/2022 | Lee | G09F 9/33 |
| 2022/0328724 A1* | 10/2022 | Jang | H10H 29/142 |
| 2023/0013848 A1* | 1/2023 | Shi | H01L 25/167 |
| 2023/0178567 A1* | 6/2023 | Zhou | H10D 86/411 |
| | | | 257/59 |

FOREIGN PATENT DOCUMENTS

| | | | | |
|---|---|---|---|---|
| CN | 111106154 A | 5/2020 | | |
| CN | 112885847 A * | 6/2021 | | H10D 86/60 |
| CN | 113964140 A | 1/2022 | | |

* cited by examiner

DISPLAY SUBSTRATE, MANUFACTURING METHOD THEREFOR, AND DISPLAY APPARATUS

CROSS-REFERENCE TO RELATED APPLICATIONS

The present application is a U.S. National Phase Entry of International Application PCT/CN2022/088012 having an international filing date of Apr. 20, 2022, and the contents disclosed in the above-mentioned application are hereby incorporated as a part of this application.

TECHNICAL FIELD

The present disclosure relates to, but is not limited to, the field of display technologies, and particularly to a display substrate, a manufacturing method therefor, and a display apparatus.

BACKGROUND

An Organic Light Emitting Diode (OLED for short) and a Quantum dot Light Emitting Diode (QLED for short) are active light emitting display devices and have advantages such as self-luminescence, a wide viewing angle, a high contrast ratio, low power consumption, extremely high response speed, lightness and thinness, flexibility, and low cost. With constant development of display technologies, a flexible display that uses an OLED or a QLED as a light emitting device and performs signal control by a Thin Film Transistor (TFT for short) has become a mainstream product in the field of display at present.

SUMMARY

The following is a summary of subject matters described herein in detail. The summary is not intended to limit the protection scope of claims.

In one aspect, a display substrate is provided in the present disclosure, which includes a drive circuit layer disposed on the base substrate that includes, at least, a first flexible layer, a second flexible layer and a base substrate conductive layer disposed between the first flexible layer and the second flexible layer, wherein the base substrate conductive layer includes, at least, a first connection line; the drive circuit layer includes, at least, a shielding conductive layer disposed on the base substrate and a functional conductive layer disposed on a side of the shielding conductive layer away from the base substrate, wherein the shielding conductive layer includes, at least, a second connection line, and the functional conductive layer includes, at least, a function signal line; the second connection line is connected with the first connection line through a first lap via, and the function signal line is connected with the second connection line through a second lap via.

In an exemplary implementation, in a direction parallel to the display substrate, the drive circuit layer includes a plurality of circuit units, and at least one of the sub-pixels includes a pixel drive circuit that is connected with the function signal line.

In an exemplary embodiment, the function signal line includes a data signal line that provides a data signal to the pixel drive circuit.

In an exemplary implementation, the function signal line includes a first power supply line that provides a power supply signal to the pixel drive circuit.

In an exemplary implementation, the drive circuit layer includes, at least, a shielding conductive layer, a first insulation layer, a semiconductor layer, a second insulation layer, a first conductive layer, a third insulation layer, a second conductive layer, a fourth insulation layer and a third conductive layer, wherein the functional conductive layer includes the third conductive layer.

In an exemplary implementation, in a region where the first lap via is located, a plurality of inorganic layers are disposed on a side of the second connection line away from the base substrate, and the plurality of inorganic layers include any one or more of the first insulation layer, the second insulation layer, the third insulation layer and the fourth insulation layer.

In an exemplary implementation, the base substrate further includes a first barrier layer disposed between the first flexible layer and the base substrate conductive layer, and a second barrier layer disposed on a side of the second flexible layer away from the first flexible layer.

In an exemplary implementation, the first lap via is disposed on the second flexible layer and the second barrier layer, the inner wall of the first lap via includes the second flexible layer and the second barrier layer, and the second connection line covers the inner wall of the first lap via.

In an exemplary implementation, the first lap via includes a first lap sub-hole and a second lap sub-hole, wherein the first lap sub-hole is disposed on the second flexible layer, the inner wall of the first lap sub-hole includes the second flexible layer, the second barrier layer covers the inner wall of the first lap sub-hole, the second lap sub-hole is disposed on the second barrier layer, the inner wall of the second lap sub-hole includes the second barrier layer, and the second connection line covers the inner wall of the second lap sub-hole.

In an exemplary implementation, the first lap sub-hole exposes a surface of the first connection line and a partial surface of the first barrier layer, and the second barrier layer covers the inner wall of the first lap sub-hole and the surface of the first barrier layer exposed by the first lap sub-hole.

In an exemplary implementation, the display substrate includes a display region and a bonding region disposed on a side of the display region; the display region includes, at least, a plurality of circuit units, the bonding region comprises, at least, a lead region and a bending region disposed sequentially along the direction away from the display region, the first lap via is disposed in the lead region, and the second lap via is disposed in the display region.

In an exemplary implementation, the lead region includes an encapsulation region and a non-encapsulation region that are sequentially disposed in the direction away from the display region, and the first lap via is disposed in the non-encapsulation region.

In an exemplary implementation, the base substrate of the bending region includes a first flexible layer, a first barrier layer, a base substrate conductive layer, and a second flexible layer.

In an exemplary implementation, the display substrate includes a display region and a bonding region disposed on a side of the display region; the display region includes, at least, a plurality of circuit units; at least one of the plurality of circuit units includes, at least, a pixel drive circuit that is connected with the data signal line; the bonding region includes, at least, a lead region and a bending region disposed sequentially along the direction away from the display region, the first lap via and the second lap via are disposed in the display region.

In an exemplary implementation, the second connection line includes, at least, a connection block, a first sub-line and a second sub-line, wherein the connection block is connected with the first connection line through the first lap via, a first end connection block of the first sub-line is connected, a second end of the first sub-line is connected with the first end of the second sub-line after extending in an opposite direction of the first direction, and the second end of the second sub-line is connected with the function signal line through the second lap via after extending in an opposite direction of the second direction.

In an exemplary implementation, a first distance between an edge of the first lap via on the side close to the second sub-line and an edge of the second sub-line on the side close to the first lap via, the first distance is 0.1 M1 to 0.5 M1, and M1 is a length of the circuit unit in the first direction.

In an exemplary implementation, the first distance is 6 μm to 30 μm.

In an exemplary implementation, a second distance between an edge of the second lap via on the side adjacent to the first sub-line and an edge of the first sub-line on the side close to the second lap via is 0.2 M2 to 1.2 M2, wherein M2 is a length of the circuit unit in the second direction.

In an exemplary implementation, the second distance is 6 μm to 70 μm.

In another aspect, the present disclosure further provides a display apparatus, including the aforementioned display substrate.

In another aspect, the present disclosure further provides a method for manufacturing a display substrate, including:

forming a base substrate, wherein the base substrate includes, at least, a first flexible layer, a second flexible layer, and a base substrate conductive layer disposed between the first flexible layer and the second flexible layer, the base substrate conductive layer includes, at least, a data connection line; and forming a drive circuit layer on the base substrate, wherein the drive circuit layer includes, at least, a shielding conductive layer disposed on the base substrate and a functional conductive layer disposed on a side of the shielding conductive layer away from the base substrate, the shielding conductive layer includes, at least, a second connection line, the functional conductive layer includes, at least, a function signal line, the second connection line is connected with the first connection line through the first lap via, and the function signal line is connected with the second connection line through the second lap via.

Other aspects may be understood upon reading and understanding the drawings and detailed description.

BRIEF DESCRIPTION OF DRAWINGS

The accompanying drawings are used for providing understanding of technical solutions of the present disclosure, and form a part of the specification. They are used for explaining the technical solutions of the present disclosure together with the embodiments of the present disclosure, but do not form a limitation on the technical solutions of the present disclosure.

4

Figure 4:
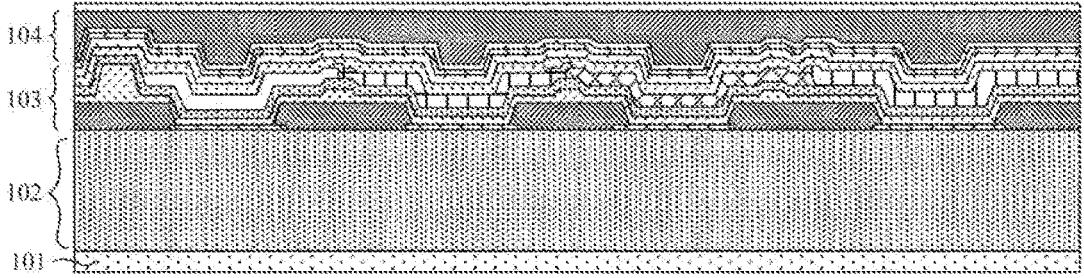

FIG. 4 illustrates schematically a cross-sectional view of a structure of a display region in a display substrate.

Figure 5:
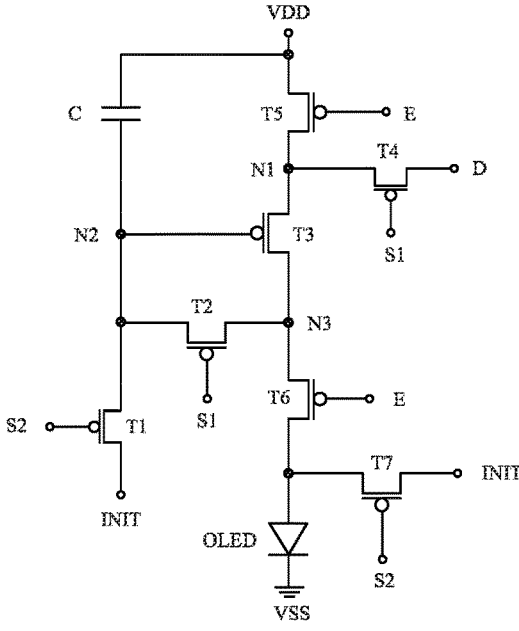

FIG. 5 is a schematic diagram of an equivalent circuit of a pixel drive circuit.

Figure 6:
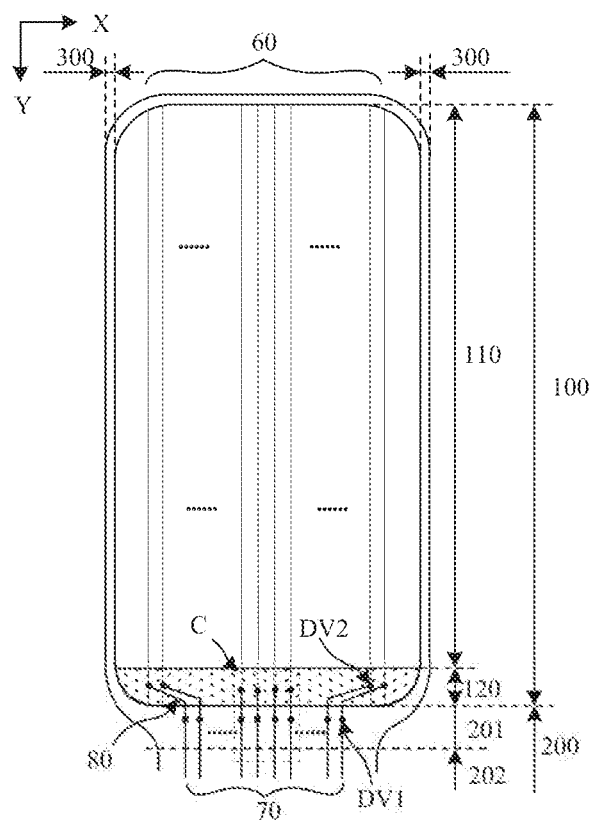

FIG. 6 is a schematic diagram of a planar structure of a display substrate according to an exemplary embodiment of the present disclosure.

Figure 7A:
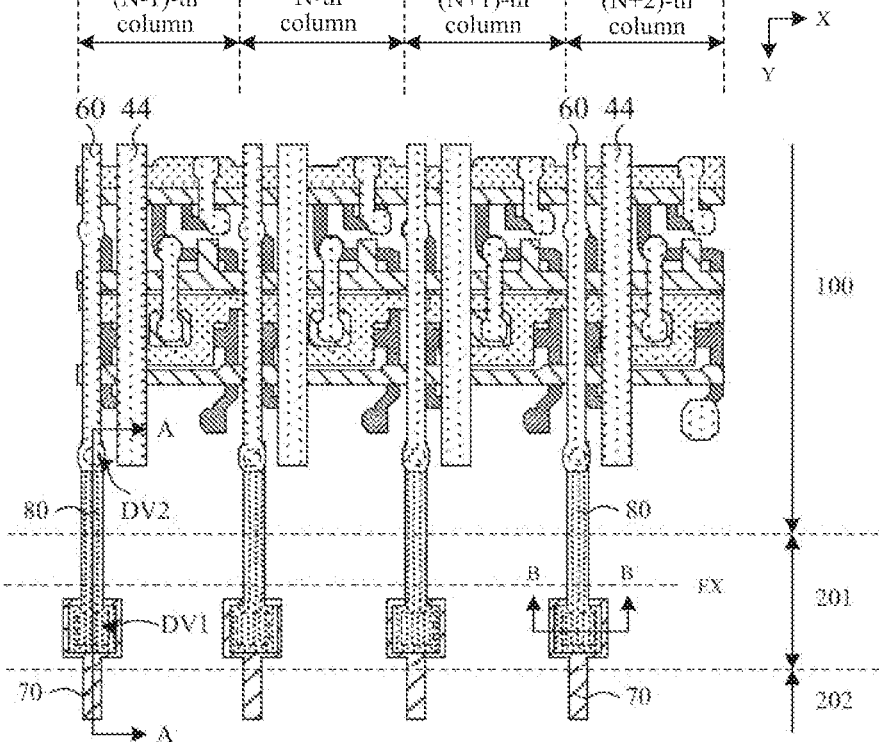
Figure 7B:
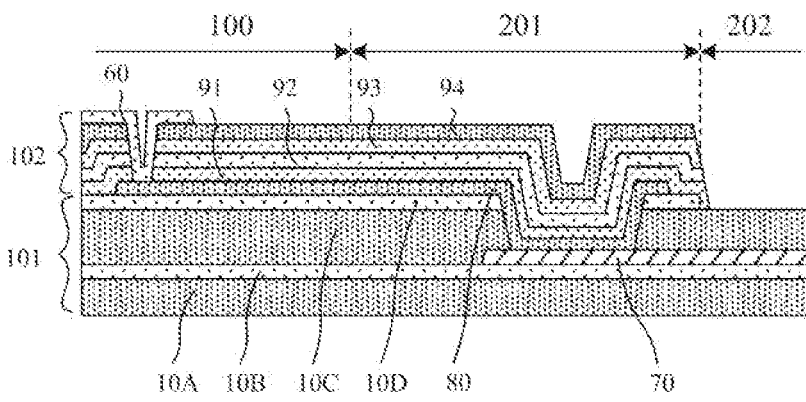

FIGS. 7a and 7b are schematic diagrams of a structure of a data connection line according to an exemplary embodiment of the present disclosure.

Figure 8A:
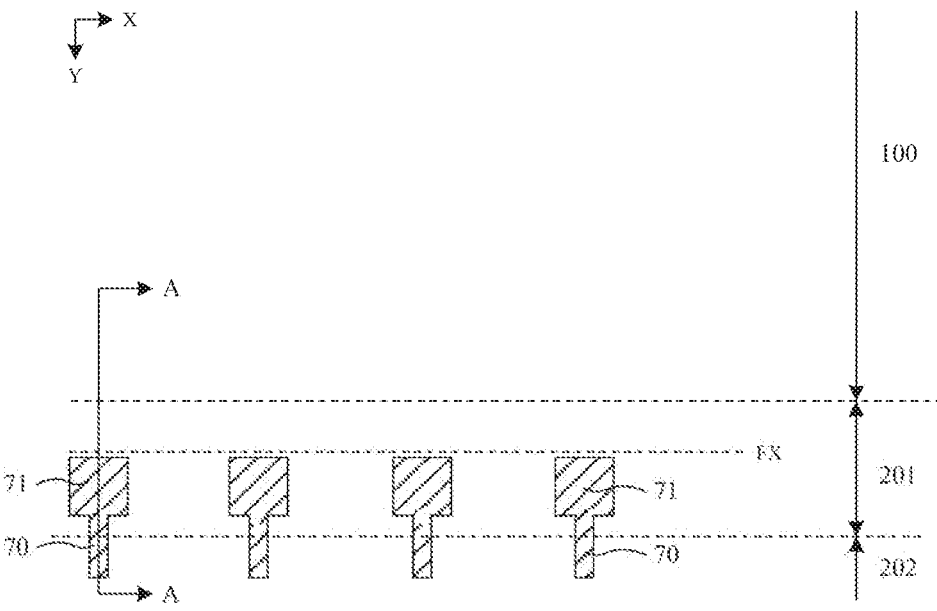
Figure 8B:
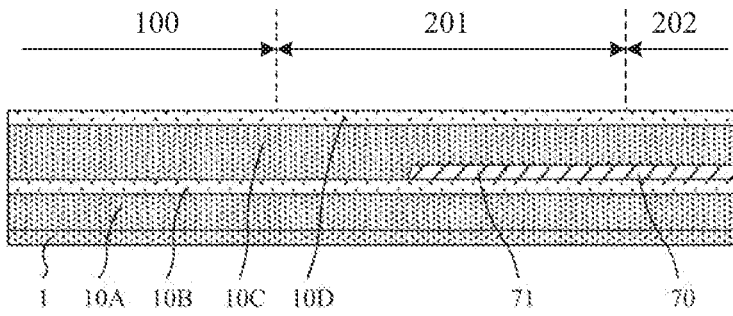

FIGS. 8A and 8b are schematic diagrams of a display substrate after a base substrate is formed according to the present disclosure.

Figure 9A:
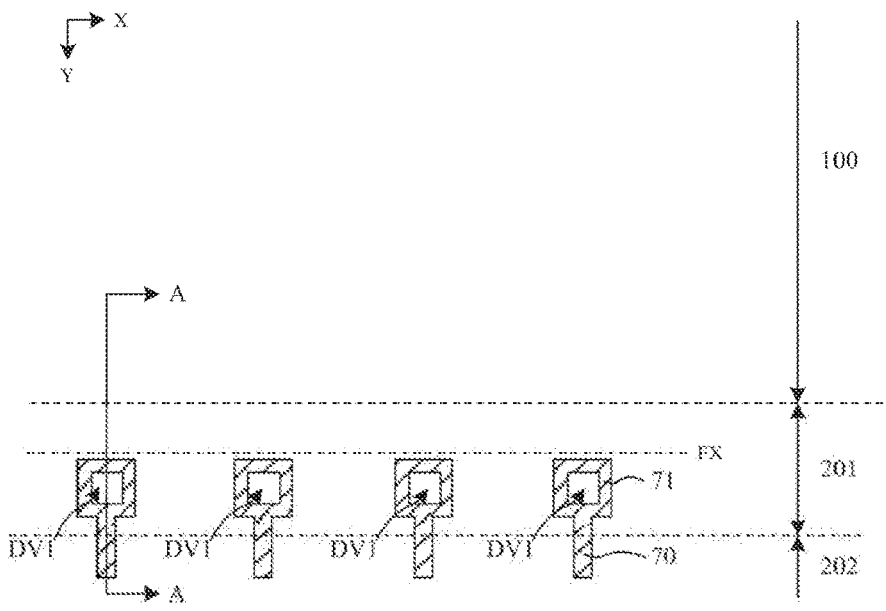
Figure 9B:
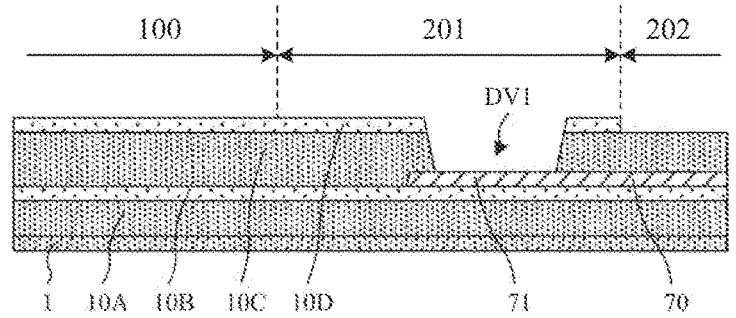

FIGS. 9a and 9b are schematic diagrams of a display substrate after a first lap via is formed therein according to the present disclosure.

Figure 10A:
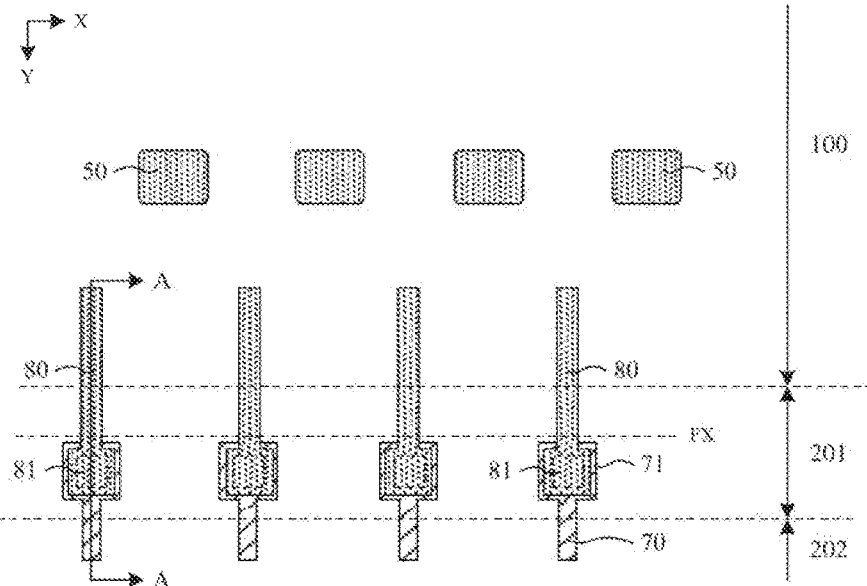
Figure 10B:
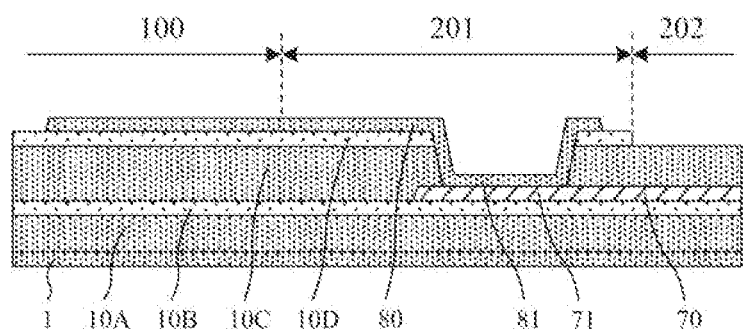

FIGS. 10a and 10b are schematic diagrams of a display substrate after a shielding conductive layer is formed therein according to the present disclosure.

Figure 11A:
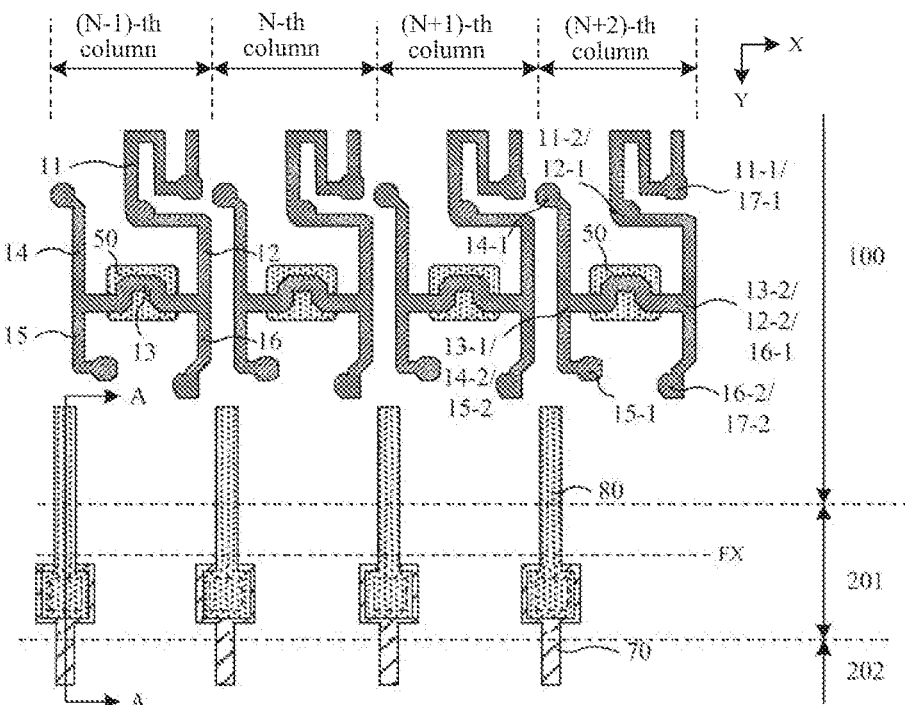
Figure 11B:
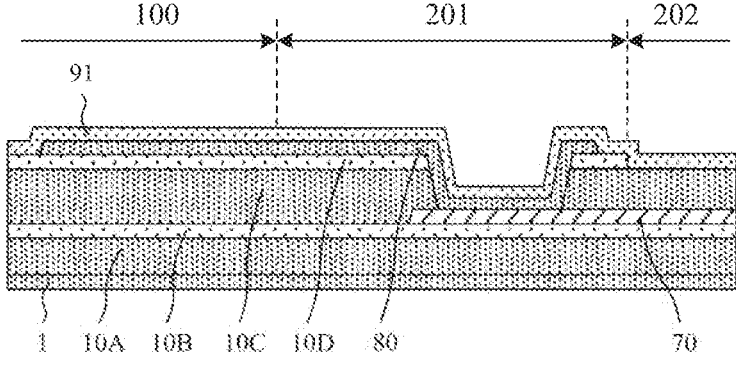

FIGS. 11a and 11b are schematic diagrams of a display substrate after a semiconductor layer is formed therein according to the present disclosure.

Figure 12A:
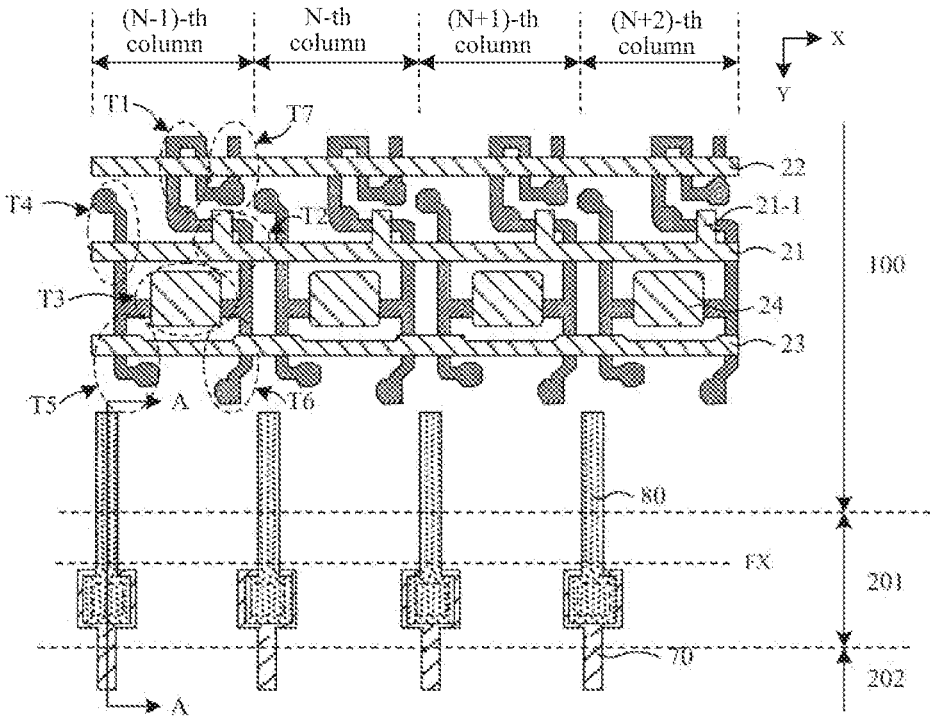
Figure 12B:
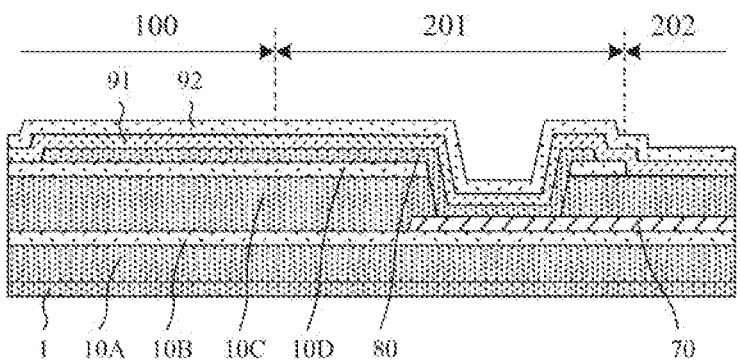

FIGS. 12a and 12b are schematic diagrams of a display substrate after a first conductive layer is formed therein according to the present disclosure.

Figure 13A:
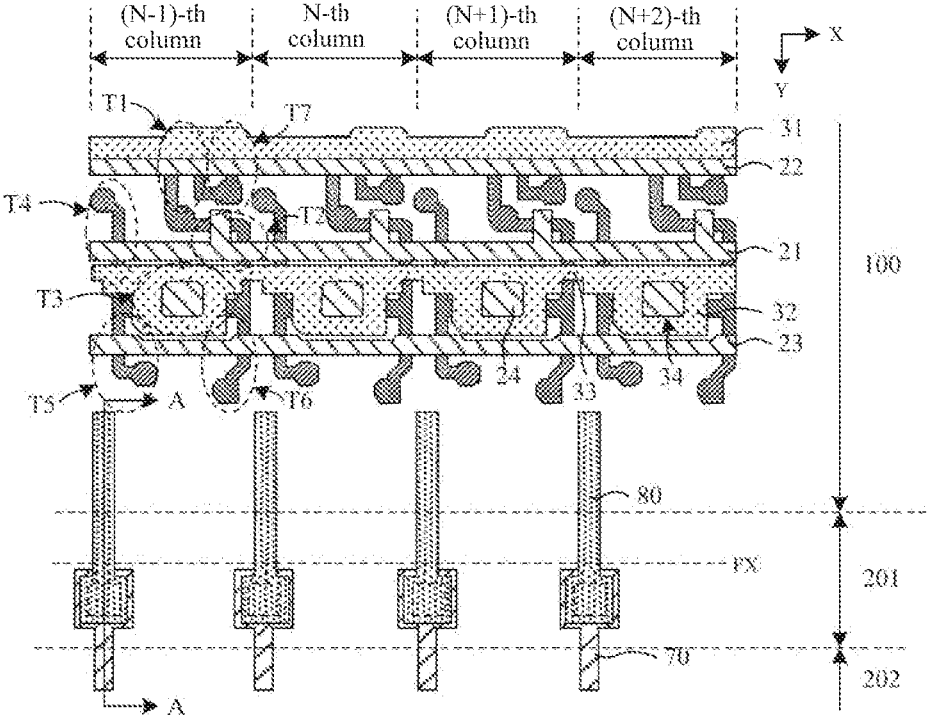
Figure 13B:
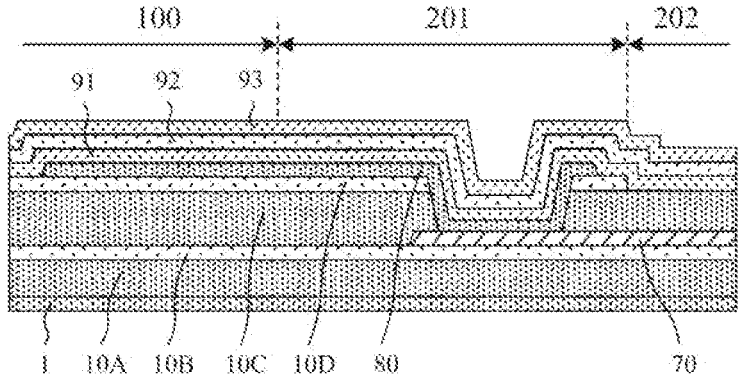

FIGS. 13 and 13b are schematic diagrams of a display substrate after a second conductive layer is formed therein according to the present disclosure.

Figure 14A:
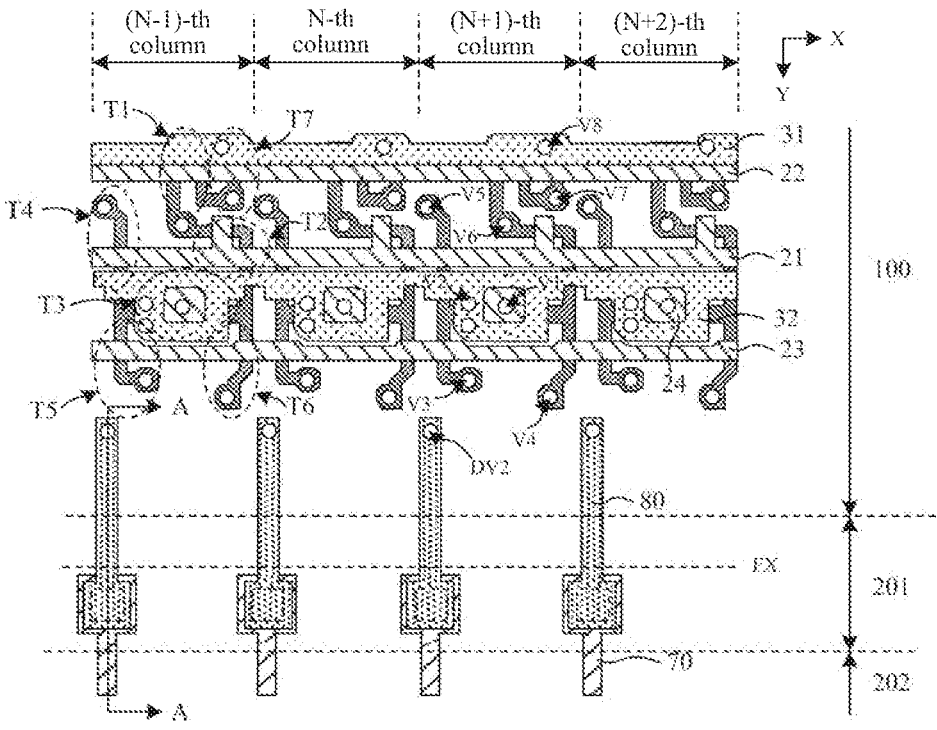
Figure 14B:
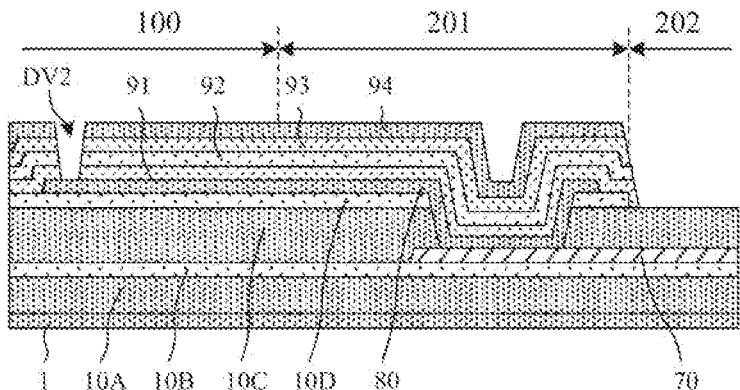

FIGS. 14a and 14b are schematic diagrams of a display substrate after a fourth insulation layer is formed therein according to the present disclosure.

Figure 15A:
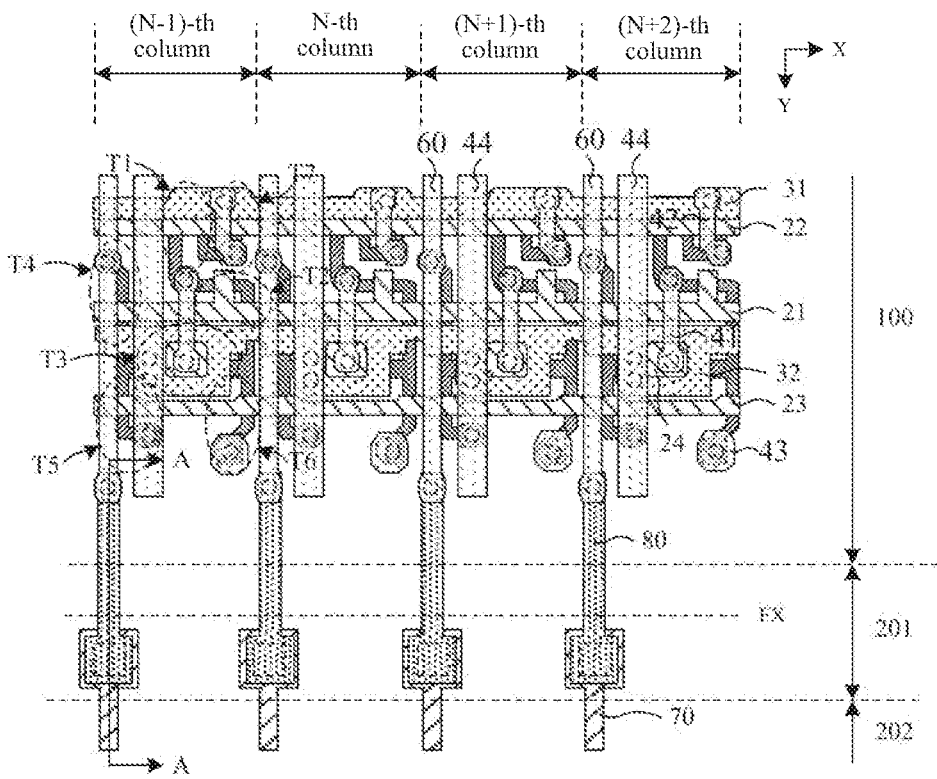
Figure 15B:
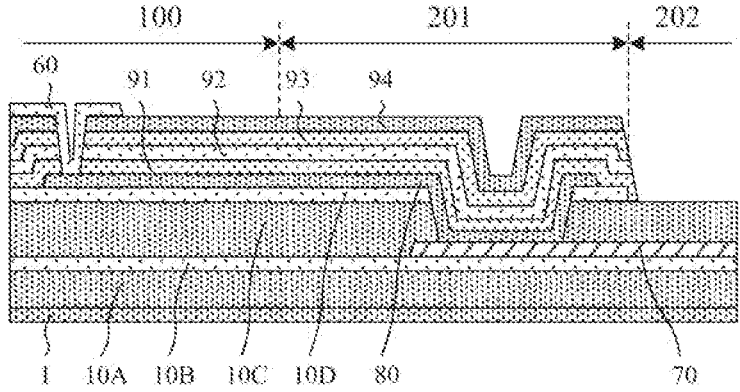

FIGS. 15a and 15b are schematic diagrams of a display substrate after a third conductive layer is formed therein according to the present disclosure.

Figure 16:
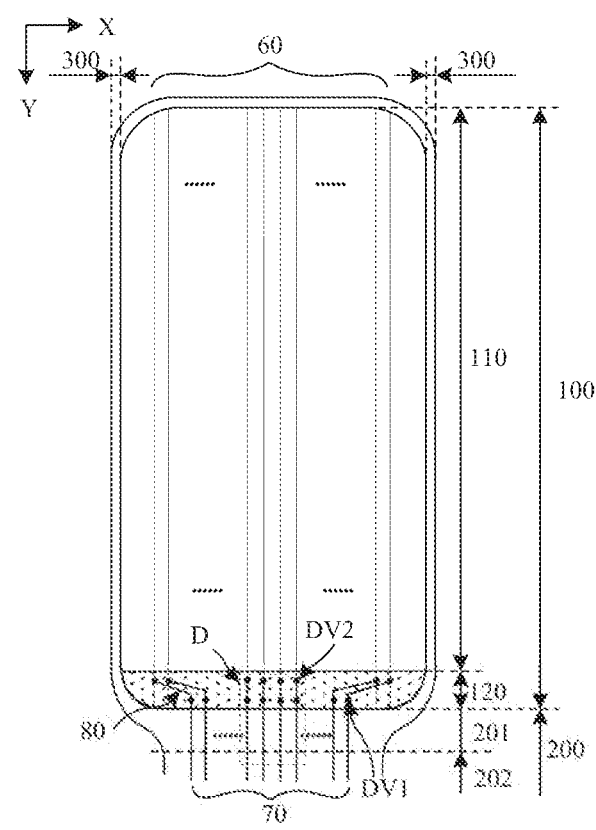

FIG. 16 illustrates a schematic diagram of a planar structure of another display substrate according to an exemplary embodiment of the present disclosure.

Figure 17:
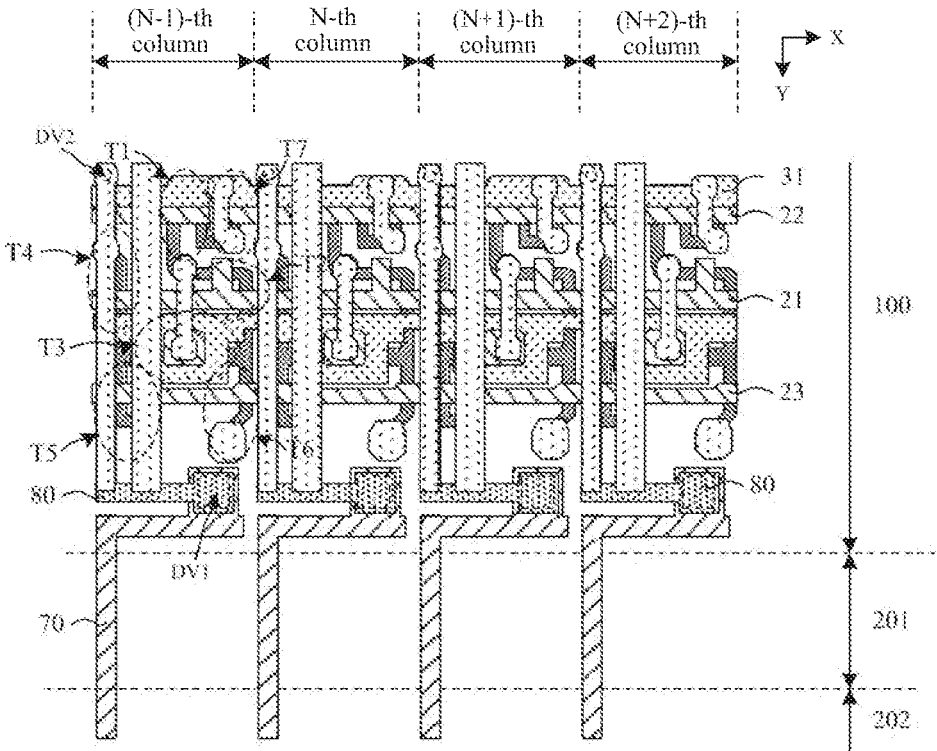

FIG. 17 illustrates a schematic diagram of a planar structure of another data connection line according to an exemplary embodiment of the present disclosure.

Figures 18, 19:
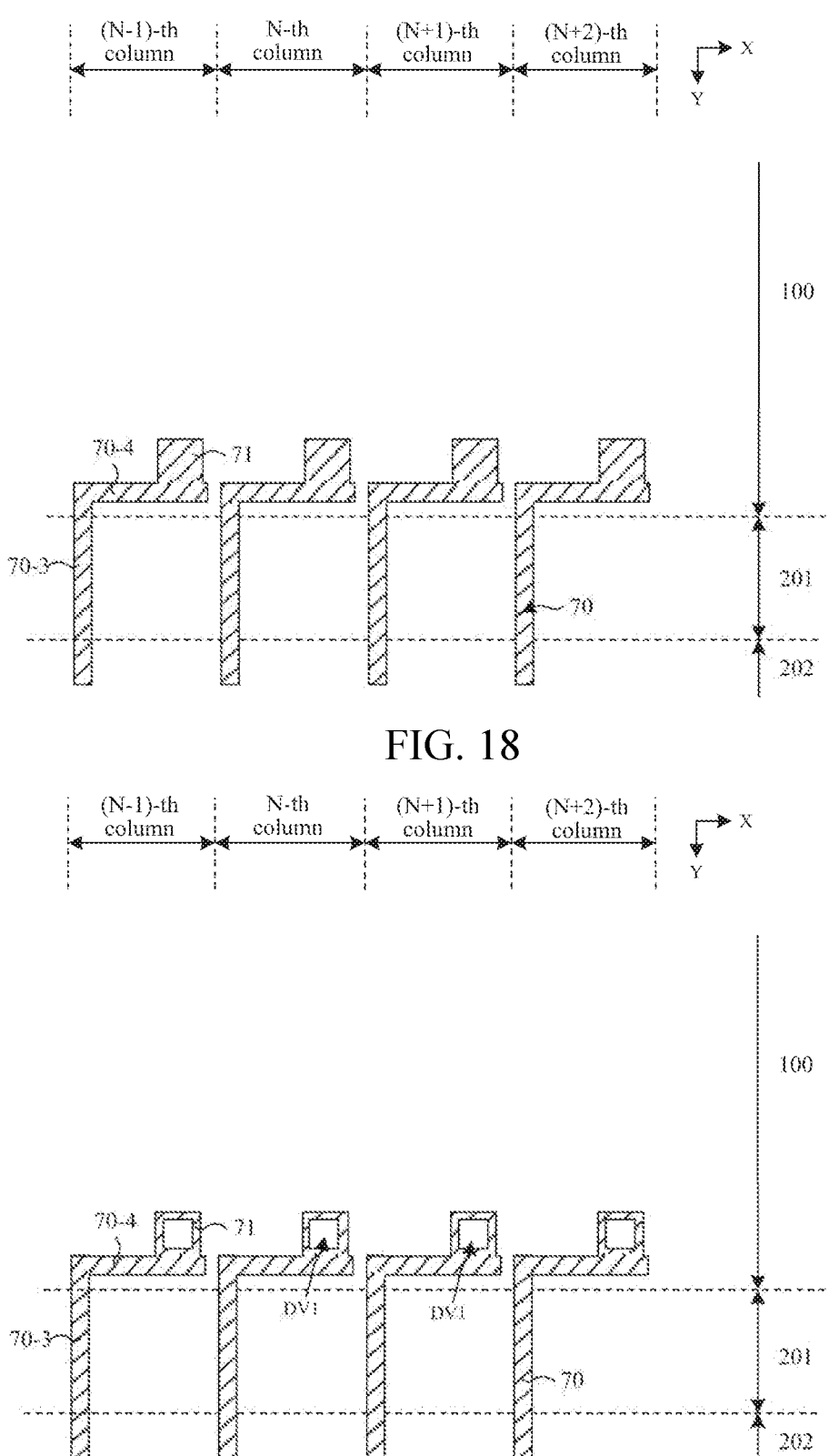

FIG. 18 is a schematic diagram of another display substrate after a base substrate is formed therein according to the present disclosure.

FIG. 19 is a schematic diagram of another display substrate after a first lap via is formed therein according to the present disclosure.

Figure 20:
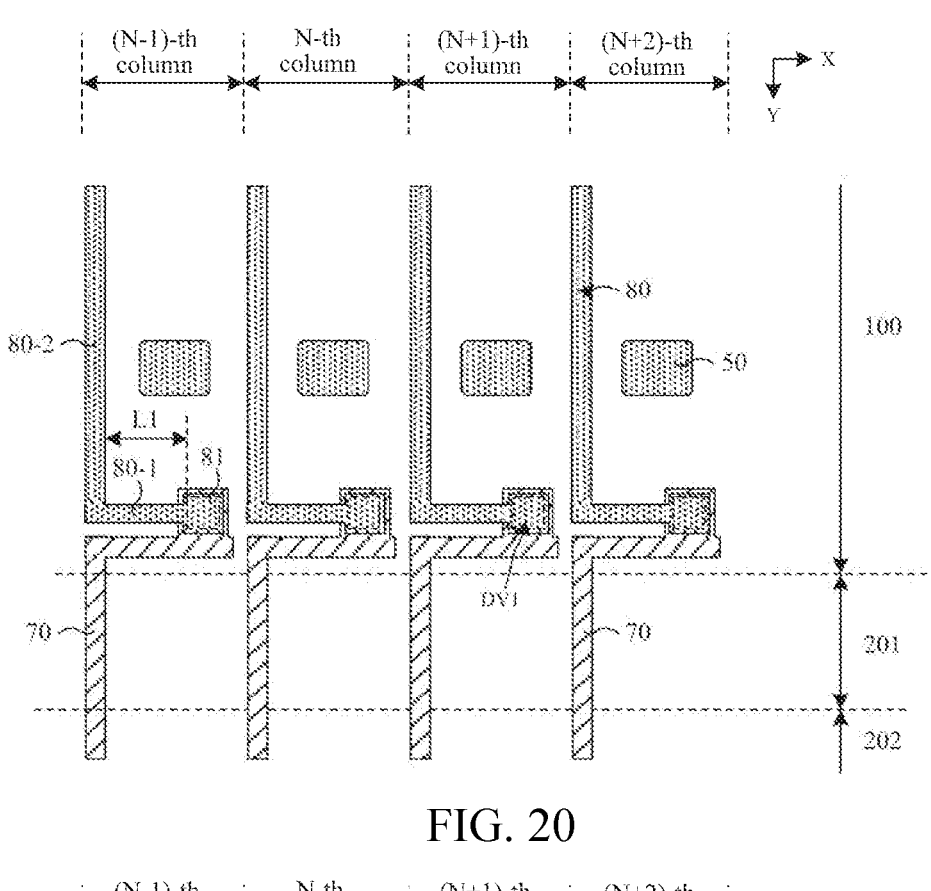

FIG. 20 is a schematic diagram of another display substrate after a shielding conductive layer is formed according to the present disclosure.

Figure 21:
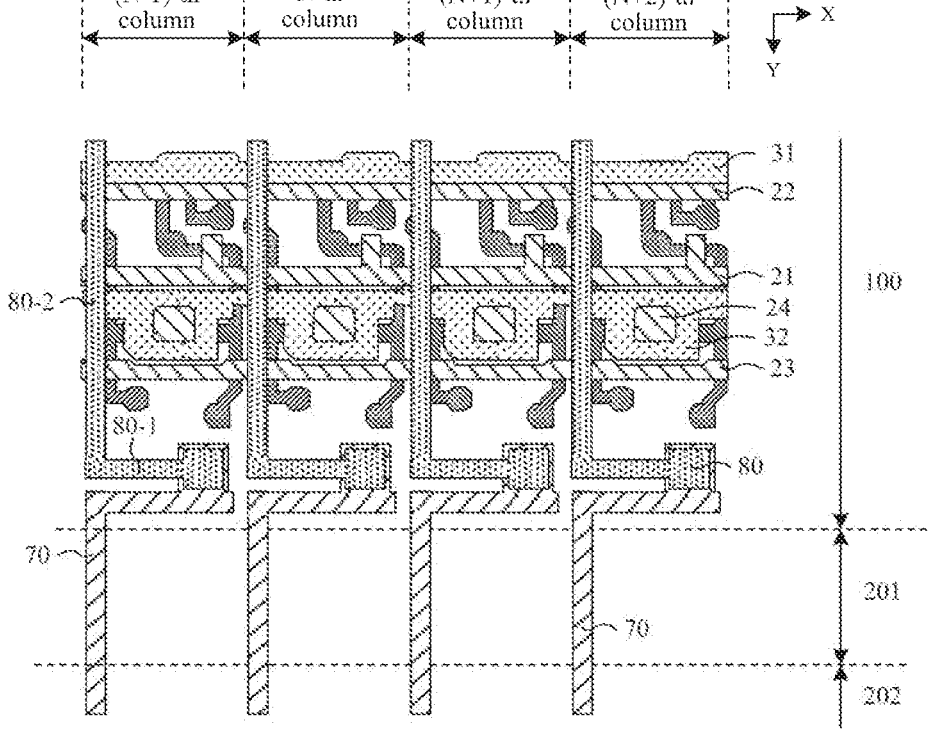

FIG. 21 is a schematic diagram of another display substrate after a second conductive layer is formed therein according to the present disclosure.

Figure 22:
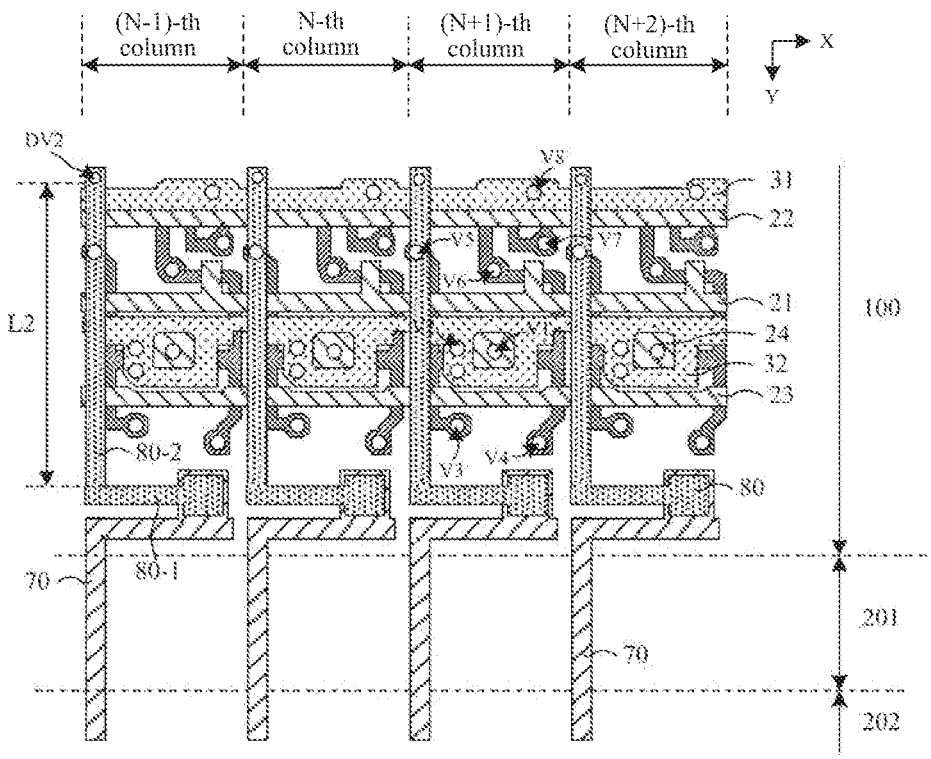

FIG. 22 is a schematic diagram of another display substrate after a fourth insulation layer is formed according to the present disclosure.

Figure 23:
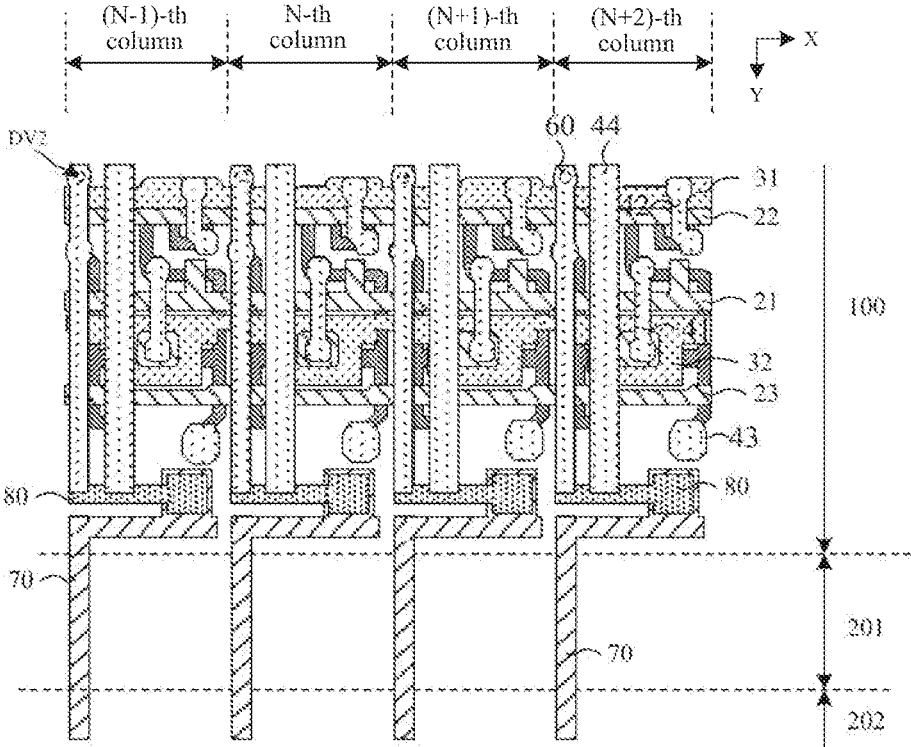

FIG. 23 is a schematic diagram of another display substrate after a third conductive layer is formed according to the present disclosure.

Figure 24:
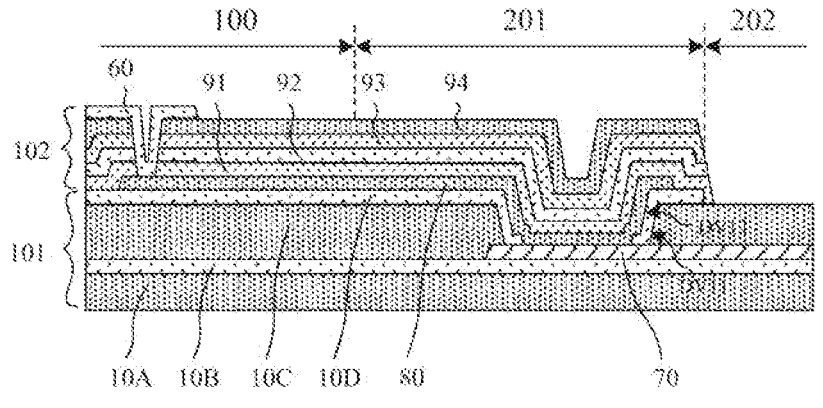

FIG. 24 illustrates a schematic diagram of a planar structure of still another data connection line according to an exemplary embodiment of the present disclosure.

Figure 25:
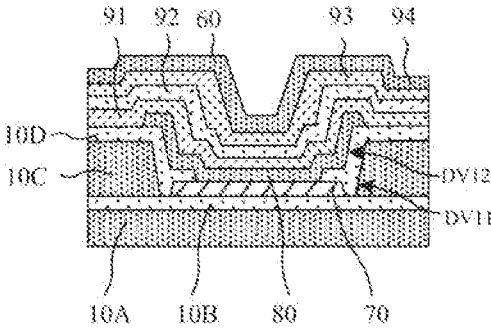

FIG. 25 illustrates a schematic diagram of a planar structure of another still data connection line according to an exemplary embodiment of the present disclosure.

DESCRIPTION OF REFERENCE NUMBERS

| | | |
|---|---|---|
| 10A-First flexible layer; | 10B-First barrier layer; | 10D-Second flexible layer; |
| 10E-Second barrier layer; | 11-First active layer; | 12-Second active layer; |
| 13-Third active layer; | 14-Fourth active layer; | 15-Fifth active layer; |
| 16-Sixth active layer; | 17-Seventh active layer; | 21-First scan signal line |
| 22-Second scan signal line | 23-Light emitting control line; | 24-First plate; |
| 31-Initial signal line; | 32-Second plate; | 33-Plate connection line; |
| 34-Opening; | 41-First connection electrode; | 42-Second connection electrode; |
| 43-Third connection electrode; | 44-First power supply line; | 50-Shielding electrode; |
| 60-Data signal line; | 70-First connection line; | 71-First connection block; |
| 80-Second connection line; | 81-Second connection block; | 91-First insulation layer; |
| 92-Second insulation layer; | 93-Third insulation layer; | 94-Fourth insulation layer; |
| 100-Display region; | 101-Base substrate; | 102-Drive circuit layer; |
| 103-Light emitting structure layer; | 104-Encapsulation structure layer; | 110-First region; |
| 120-Second region; | 200-Bonding region; | 201-Lead region; |
| 202-bending region; | 300-bezel region. | |

Detailed Description

To make objectives, technical solutions, and advantages of the present disclosure clearer, the embodiments of the present disclosure will be described in detail with reference to the accompanying drawings. It is to be noted that implementations may be implemented in a plurality of different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other without conflict.

Scales of the drawings in the present disclosure may be used as a reference in the actual process, but are not limited thereto. For example, the width-length ratio of the channel, the thickness and spacing of each film layer, and the width and spacing of each signal line may be adjusted according to actual needs. The number of pixels in the display substrate and the number of sub-pixels in each pixel are not limited to the numbers shown in the drawings. The drawings described in the present disclosure are schematic structure diagrams only, and one implementation of the present disclosure is not limited to the shapes, numerical values or the like shown in the drawings.

Ordinal numerals such as "first", "second", and "third" in the specification are set to avoid confusion of constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, or a detachable connection, or an integrated connection. It may be a mechanical connection or an electrical connection. It may be a direct mutual connection, or an indirect connection through middleware, or internal communication between two components. Those of ordinary skill in the art may understand specific meanings of these terms in the present disclosure according to specific situations.

In the specification, a transistor refers to a component which includes at least three terminals, i.e., a gate electrode, a drain electrode and a source electrode. The transistor has a channel region between the drain electrode (drain electrode terminal, drain region, or drain electrode) and the source electrode (source electrode terminal, source region, or source electrode), and a current may flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be the source electrode, and the second electrode may be the drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode", as well as the "source terminal" and the "drain terminal" are interchangeable in the specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

Triangle, rectangle, trapezoid, pentagon and hexagon in this specification are not strictly defined, and they may be approximate triangle, rectangle, trapezoid, pentagon or hexagon, etc. There may be some small deformation caused by tolerance, and there may be chamfer, arc edge and deformation, etc. In the present disclosure, "about" refers to that a boundary is defined not so strictly and numerical values within process and measurement error ranges are allowed.

Figure 1:
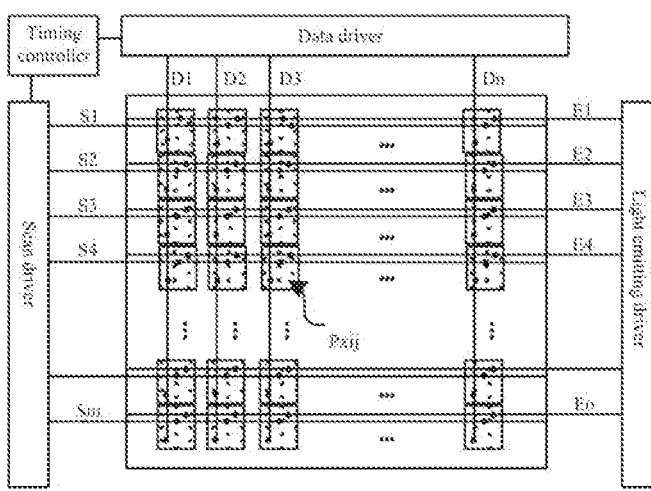
FIG. 1 is a schematic diagram of a structure of a display apparatus.

FIG. 1 is a schematic diagram of a structure of a display apparatus. As shown in FIG. 1, the display apparatus may include a timing controller, a data driver, a scan driver, a light emitting driver and a pixel array. The timing controller is connected to the data driver, the scan driver and the light emitting driver, respectively, the data driver is connected to a plurality of data signal lines (D1 to Dn) respectively, the scan driver is connected to a plurality of scan signal lines (S1 to Sm) respectively, and the light emitting driver is connected to a plurality of light emitting signal lines (E1 to Eo) respectively. The pixel array may include a plurality of sub-pixels Pxij, wherein both of i and j may be natural numbers. At least one of the sub-pixels Pxij may include a circuit unit and a light emitting device connected to the circuit unit, wherein the circuit unit may include, at least, a pixel drive circuit that is connected to a scan signal line, a data signal line and a pixel drive circuit, respectively. In an exemplary implementation, the timing controller may provide the data driver a gray-scale value and a control signal which are suitable for a specification of the data driver, provide the scan driver a clock signal, a scan start signal and the like which are suitable for a specification of the scan driver, and provide the light emitting driver a clock signal, a transmit stop signal and the like which are suitable for a specification of the light emitting driver. The data driver may generate a data voltage to be provided to the data signal lines D1, D2, D3, . . . , and Dn by using the gray-scale value and the control signal that are received from the timing controller. For example, the data driver may sample the gray-scale value according to the clock signal and apply a data voltage, in pixel rows, corresponding to the gray-scale value to the data signal lines D1 to Dn, wherein n may be a natural number. The scan driver may receive the clock signal, the scan start signal and the like from the timing controller to generate a scan signal to be provided to the scan signal lines S1, S2, S3, . . . , and Sm. For example, the scan driver may provide a scan signal with an on-level pulse to the scan signal lines S1 to Sm sequentially. For example, the scan driver may be configured in a form of a shift register and may generate a scan signal in a manner in which the scan start signal provided in a form of an on-level pulse is transmitted to a circuit in a next stage sequentially under the control of the clock signal, wherein m may be a natural number. The light emitting driver may receive a clock signal, a transmit stop signal and the like from the timing controller to generate a transmit signal to be provided to the light emitting signal lines E1, E2, E3, . . . , and Eo. For example, the light emitting driver may provide a transmit signal with an off-level pulse to the light emitting signal lines E1 to Eo sequentially. For example, the light emitting driver may be configured in a form of a shift register and may generate a transmit signal in a manner in which the transmit stop signal provided in a form of an off-level pulse is transmitted to a circuit in a next stage sequentially under the control of the clock signal, wherein o may be a natural number.

Figure 2:
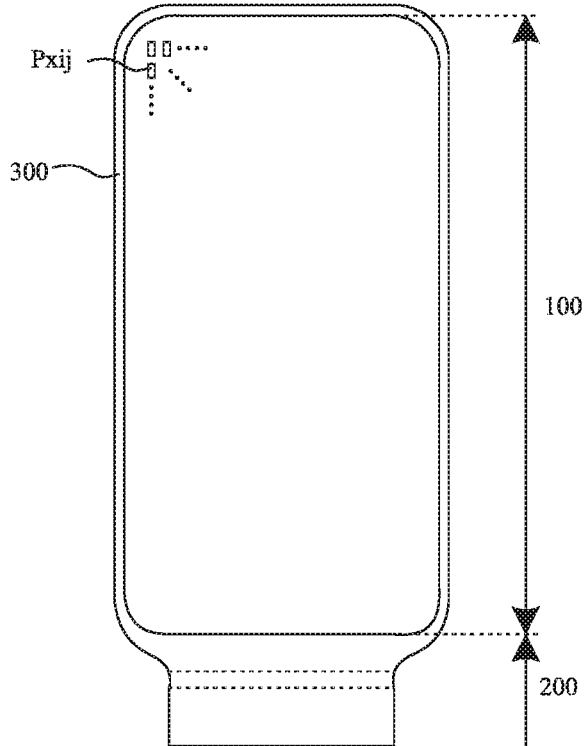
FIG. 2 is a schematic diagram of a structure of a display substrate.

FIG. 2 is a schematic diagram of a structure of a display substrate. As shown in FIG. 2, the display substrate may include a display region 100, a bonding region 200 on one side of the display region 100, and a bezel region 300 on other sides of the display region 100. In an exemplary implementation, the display region 100 may be a planar region including a plurality of sub-pixels Pxij that constitute a pixel array. The plurality of sub-pixels Pxij are configured to display a dynamic picture or a still image, and the display region 100 may be referred to as an Active Area (AA for short). In an exemplary implementation, the display substrate may be deformable, e.g., may be crimped, bent, folded, or curled.

In an exemplary implementation, the bonding region 200 may include a fanout region, a bending region, a driver chip region, and a bonding pin region that are disposed sequentially along a direction away from the display region 100. The fanout region is connected to the display region 100, and may include, at least, a plurality of data connection lines that are configured to connect a data signal line in the display region in a fanout wiring mode. The bending region is connected to the fanout region and may include a composite insulation layer provided with a groove, and is configured to bend the bonding region to a back of the display region. The driver chip region may include, at least, an Integrated Circuit (IC for short), and is configured to connect to a plurality of data connection lines. The bonding pin region may include, at least, a plurality of bonding pads, and is configured to bond to and connect to an external Flexible Printed Circuit (FPC for short).

In an exemplary implementation, the bezel region 300 may include a circuit region, a power supply line region, and a crack dam region and a cutting region which are sequentially disposed along the direction away from the display region 100. The circuit region is connected with the display region 100 and may include, at least, a gate drive circuit which is connected with a first scan line, a second scan line and a light emitting control line of a pixel drive circuit in the display region 100. The power supply line region is connected to the circuit region and may include, at least, a bezel power supply lead that extends along a direction parallel to an edge of the display region and is connected with a cathode in the display region 100. The crack dam region is connected to the power supply line region and may include, at least, a plurality of cracks disposed on the composite insulation layer. The cutting region is connected to the crack dam region and may include, at least, a cutting groove disposed on the composite insulation layer, and the cutting groove is used for cutting respectively along the cutting groove by a cutting device after all film layers of the display substrate are prepared.

In an exemplary implementation, the fanout region in the bonding region 200 and the power supply line region in the bezel region 300 may be provided with a first isolation dam and a second isolation dam, the first isolation dam and the second isolation dam may extend in a direction parallel to the edges of the display region 100, forming an annular structure surrounding the display region 100, wherein each of the edges of the display region is an edge on one side of the display region, the bonding region or the bezel region.

Figure 3:
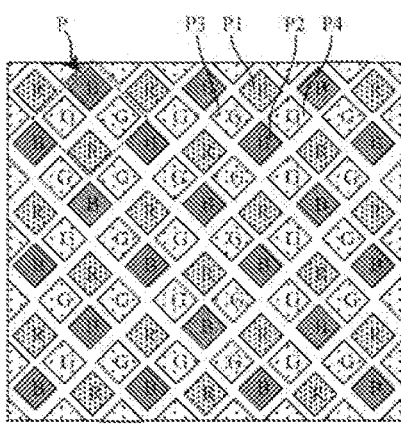
FIG. 3 is a schematic diagram of a planar structure of a display region in a display substrate.

FIG. 3 is a schematic diagram of a planar structure of a display region in a display substrate. As shown in FIG. 3, the display substrate may include a plurality of pixel units P arranged in a matrix. At least one pixel unit P includes a first sub-pixel P1 emitting light of a first color, a second sub-pixel P2 emitting light of a second color, a third sub-pixel P3 and a fourth sub-pixel P4 which emit light of a third color. Each circuit unit may include a circuit unit and a light emitting device. The circuit unit may include, at least, a pixel drive circuit which is connected with a scan signal line, a data signal line, and a light emitting signal line respectively. The pixel drive circuit is configured to receive a data voltage transmitted by the data signal line and output a corresponding current to the light emitting device, under the control of the scan signal line and the light emitting signal line. The light emitting device in each sub-pixel is connected with a pixel drive circuit of a sub-pixel where the light emitting device is located, and is configured to emit light with a corresponding brightness in response to a current output by the pixel drive circuit of the sub-pixel where the light emitting device is located.

In an exemplary implementation, the first sub-pixel P1 may be a red sub-pixel (R) emitting red light, the second sub-pixel P2 may be a blue sub-pixel (B) emitting blue light, and the third sub-pixel P3 and the fourth sub-pixel P4 may be green sub-pixels (G) emitting green light. In an exemplary implementation, the shape of the sub-pixel may be a rectangle, a diamond, a pentagon or a hexagon. Four sub-pixels may be arranged in the form of the diamond to form an RGBG pixel arrangement. In other exemplary implementations, the four sub-pixels may be arranged side by side horizontally, side by side vertically, or in a square-shaped manner, which is not limited in the present disclosure.

In an exemplary implementation, the pixel unit may include three sub-pixels, the three sub-pixels may be arranged in manner of horizontal juxtaposition, vertical juxtaposition or triangle, which is not limited in the present disclosure.

FIG. 4 illustrates schematically a cross-sectional view of a structure of a display region in a display substrate, illustrating a structure of four sub-pixels in the display region. As shown in FIG. 4, in a direction perpendicular to the display substrate, the display substrate may include a drive circuit layer 102 disposed on a base substrate 101, a light emitting structure layer 103 disposed on a side of the drive circuit layer 102 away from the base substrate 101, and an encapsulation structure layer 104 disposed on a side of the light emitting structure layer 103 away from the base substrate 101. In some possible implementations, the display substrate may include other film layers, such as a touch structure layer, which is not limited in the present disclosure.

In an exemplary implementation, the base substrate 101 may be a flexible base substrate, or a rigid base substrate. The drive circuit layer 102 may include a plurality of circuit units, each of which includes a pixel drive circuit, at least. The light emitting structure layer 103 includes, at least, a plurality of light emitting devices, each of the light emitting devices includes, at least, an anode, an organic light emitting layer and a cathode, wherein the organic light emitting layer is driven by the anode and the cathode to emit light of a corresponding color. The encapsulation layer 104 may include a first encapsulation layer, a second encapsulation layer, a third encapsulation layer that are stacked, wherein the first encapsulation layer and the third encapsulation layer may be made of an inorganic material, the second encapsulation layer may be made of an organic material, and the second encapsulation layer is disposed between the first encapsulation layer and the third encapsulation layer to form an inorganic material/organic material/inorganic material laminated structure and ensure that external water and oxygen cannot enter the light emitting structure layer 103.

In an exemplary implementation, the organic light emitting layer may include an Emitting Layer (EML), and any one or more of following layers: a Hole Injection Layer (HIL), a Hole Transport Layer (HTL), an Electron Barrier Layer (EBL), a Hole Barrier Layer (HBL), an Electron Transport Layer (ETL), and an Electron Injection Layer (EIL). In an exemplary implementation, one or more layers of hole injection layers, hole transport layers, electron barrier layers, hole barrier layers, electron transport layers, and electron injection layers of all sub-pixels may be a common layer communicated together. Emitting layers of adjacent sub-pixels may be overlapped slightly, or may be mutually isolated.

FIG. 5 is a schematic diagram of an equivalent circuit of a pixel drive circuit. In an exemplary implementation, the pixel drive circuit may have a structure of 3T1C, 4T1C, 5T1C, 5T2C, 6T1C, 7T1C or 8T1C. As shown in FIG. 5, the pixel drive circuit may include seven transistors (a first transistor T1 to a seventh transistor T7), one storage capacitor C. The pixel drive circuit is connected with seven signal lines (a data signal line D, a first scan signal line S1, a second scan signal line S2, a light emitting signal line E, an initial signal line INIT, a first power supply line VDD, and a second power supply line VSS) respectively.

In an exemplary implementation, the pixel drive circuit may include a first node N1, a second node N2, and a third node N3. Herein, the first node N1 is respectively connected with a first electrode of the third transistor T3, a second electrode of the fourth transistor T4, and a second electrode of the fifth transistor T5, the second node N2 is respectively connected with a second electrode of the first transistor, a first electrode of the second transistor T2, a control electrode of the third transistor T3, and a second end of the storage capacitor C, and the third node N3 is respectively connected with a second electrode of the second transistor T2, a second electrode of the third transistor T3, and a first electrode of the sixth transistor T6.

In an exemplary implementation, a first end of the storage capacitor C is connected with the first power supply line VDD, and the second end of the storage capacitor C is connected with the second node N2, i.e., the second end of the storage capacitor C is connected with the control electrode of the third transistor T3.

A control electrode of the first transistor T1 is connected with the second scan signal line S2, a first electrode of the first transistor T1 is connected with an initial signal line INIT, and the second electrode of the first transistor is connected with the second node N2. When a scan signal with an on-level is applied to the second scan signal line S2, the first transistor T1 transmits an initialization voltage to the control electrode of the third transistor T3 so as to initialize a charge amount of the control electrode of the third transistor T3.

A control electrode of the second transistor T2 is connected with the first scan signal line S1, the first electrode of the second transistor T2 is connected with the second node N2, and the second electrode of the second transistor T2 is connected with the third node N3. When a scan signal with an on-level is applied to the first scan signal line S1, the second transistor T2 enables the control electrode of the third transistor T3 to be connected with a second electrode of the third transistor T3.

The control electrode of the third transistor T3 is connected with the second node N2, i.e., the control electrode of the third transistor T3 is connected with the second end of the storage capacitor C, a first electrode of the third transistor T3 is connected with the first node N1, and the second electrode of the third transistor T3 is connected with the third node N3. The third transistor T3 may be referred to as a drive transistor, and the third transistor T3 determines an amount of a drive current flowing between the first power supply line VDD and the second power supply line VSS according to a potential difference between the control electrode and the first electrode of the third transistor T3.

A control electrode of the fourth transistor T4 is connected with the first scan signal line S1, a first electrode of the fourth transistor T4 is connected with the data signal line D, and a second electrode of the fourth transistor T4 is connected with the first node N1. The fourth transistor T4 may be referred to as a switch transistor, a scan transistor, etc., and when a scan signal with an on-level is applied to the first scan signal line S1, the fourth transistor T4 enables a data voltage of the data signal line D to be input to the pixel drive circuit.

A control electrode of the fifth transistor T5 is connected with the light emitting signal line E, a first electrode of the fifth transistor T5 is connected with the first power supply line VDD, and a second electrode of the fifth transistor T5 is connected with the first node N1. A control electrode of the sixth transistor T6 is connected with the light emitting signal line E, a first electrode of the sixth transistor T6 is connected with the third node N3, and a second electrode of the sixth transistor T6 is connected with a first electrode of a light emitting device. The fifth transistor T5 and the sixth transistor T6 may be referred to as light emitting transistors. When a light emitting signal with an on-level is applied to the light emitting signal line E, the fifth transistor T5 and the sixth transistor T6 enable the light emitting device to emit light by forming a drive current path between the first power supply line VDD and the second power supply line VSS.

A control electrode of the seventh transistor T7 is connected with the second scan signal line S2, a first electrode of the seventh transistor T7 is connected with the initial signal line INIT, and a second electrode of the seventh transistor T7 is connected with the first electrode of the light emitting device. When a scan signal with an on-level is applied to the second scan signal line S2, the seventh transistor T7 transmits an initialization voltage to the first electrode of the light emitting device so as to initialize a charge amount accumulated in the first electrode of the light emitting device or release a charge amount accumulated in the first electrode of the light emitting device.

In an exemplary implementation, the light emitting device may be an OLED including a first electrode (anode), an organic light emitting layer, and a second electrode (cathode), which are stacked, or may be a QLED including a first electrode (anode), a quantum dot light emitting layer, and a second electrode (cathode), which are stacked.

In an exemplary implementation, the second electrode of the light emitting device is connected with the second power supply line VSS, a signal of the second power supply line VSS is a low-level signal continually supplied, and a signal of the first power supply line VDD is a high-level signal continuously supplied.

In an exemplary implementation, the first transistor T1 to the seventh transistor T7 may be P-type transistors or N-type transistors. Use of a same type of transistors in a pixel drive circuit may simplify a process flow, reduce process difficulties of a display panel, and improve a product yield. In some possible implementations, the first transistor T1 to the seventh transistor T7 may include P-type transistors and N-type transistors.

In an exemplary implementation, the first transistor T1 to the seventh transistor T7 may be low temperature poly silicon thin film transistors, or may be oxide thin film transistors, or may be low temperature poly silicon thin film transistors and oxide thin film transistors. An active layer of a low temperature poly silicon thin film transistor may be made of Low Temperature Poly Silicon (LTPS for short), and an active layer of an oxide thin film transistor may be made of an oxide semiconductor (Oxide). The low temperature poly-silicon thin film transistor has advantages such as high migration rate and fast charging. The oxide thin film transistor has advantages such as low drain current. The low temperature poly-silicon thin film transistor and the oxide thin film transistor are integrated on one display substrate to form a Low Temperature Polycrystalline Oxide (LTPO for short) display substrate, so that advantages of the low temperature poly-silicon thin film transistor and the oxide thin film transistor can be utilized, low-frequency drive can be realized, power consumption can be reduced, and display quality can be improved.

Taking all of the seven transistors being N-type transistors as an example, the operation process of the pixel drive circuit may include the following stages.

In a first stage A1, referred to as a reset stage, a signal of the second scan signal line S2 is a low-level signal, and signals of the first scan signal line S1 and the light emitting signal line E are high-level signals. The signal of the second scan signal line S2 is a low-level signals, which causes the first transistor T1 and the seventh transistor T7 to be turned on. The first transistor T1 is turned on such that the initial voltage of the initial signal line INIT is provided to a second node N2 to initialize the storage capacitor C to clear an original data voltage in the storage capacitor. The seventh transistor T7 is turned on, so that an initialization voltage of the initial signal line INIT is provided to a first electrode of the OLED to initialize (reset) the first electrode of the OLED and clear a pre-stored voltage therein, thereby completing initialization. The signals of the first scan signal line S1 and the light emitting signal line E are high-level signals, so that the second transistor T2, the fourth transistor T4, the fifth transistor T5 and the sixth transistor T6 are turned off. An OLED does not emit light in this stage.

In a second stage A2, referred to as a data writing stage or a threshold compensation stage, the signal of the first scan signal line S1 is a low-level signal, signals of the second scan signal line S2 and the light emitting signal line E are high-level signals, and the data signal line D outputs a data voltage. In this stage, a second end of the storage capacitor C is at a low level, so the third transistor T3 is turned on. The signal of the first scan signal line S1 is a low-level signal, so that the second transistor T2 and the fourth transistor T4 are turned on. The second transistor T2 and the fourth transistor T4 are turned on, so that the data voltage output by the data signal line D is provided to the second node N2 through a first node N1, the turned-on third transistor T3, a third node N3, and the turned-on second transistor T2, and the storage capacitor C is charged with a difference between the data voltage output by the data signal line D and a threshold voltage of the third transistor T3. A voltage at the second end (the second node N2) of the storage capacitor C is Vd−|Vth|, wherein Vd is the data voltage output by the data signal line D, and Vth is the threshold voltage of the third transistor T3. The signal of the second scan signal line S2 is the high-level signal, so that the first transistor T1 and the seventh transistor T7 are turned off. The signal of the light emitting signal line E is a high-level signal, so that the fifth transistor T5 and the sixth transistor T6 are turned off.

In a third stage A3, referred to as a light emitting stage, the signal of the light emitting signal line E is a low-level signal, and the signals of the first scan signal line S1 and the second scan signal line S2 are high-level signals. The signal of the light emitting signal line E is a low-level signal, so that the fifth transistor T5 and the sixth transistor T6 are turned on, and a power voltage output by the first power supply line VDD provides a drive voltage to the first electrode of the OLED through the turned-on fifth transistor T5, third transistor T3, and sixth transistor T6 to drive the OLED to emit light.

In a drive process of the pixel drive circuit, a drive current flowing through the third transistor T3 (drive transistor) is determined by a voltage difference between a gate electrode and a first electrode of the third transistor T3. The voltage of the second node N2 is Vdata-|Vth|, so the drive current of the third transistor T3 is as follows.

$$I = K*(Vgs - Vth)^2 = K*[(Vdd - Vd + |Vth|) - Vth]^2 = K*[(Vdd - Vd]^2$$

Herein, I is the drive current flowing through the third transistor T3, i.e., a drive current for driving the OLED, K is a constant, Vgs is the voltage difference between the gate electrode and the first electrode of the third transistor T3, Vth is the threshold voltage of the third transistor T3, Vd is the data voltage output by the data signal line D, and Vdd is the power voltage output by the first power supply line VDD.

With the development of OLED display technologies, consumers have higher requirements for the display effect of display products. Super-narrow bezels have become a new trend in the development of display products. Therefore, bezel narrowing or even a bezel-less design has received more attention in the design of OLED display products. In a display substrate, a data connection line is disposed in a fanout region of a bonding region. Due to a width of the fanout region smaller than that of the display region, the data connection line has to be introduced into the wider display region in a fan-out wiring mode. The larger the width difference between the display region and the bonding region, the more oblique fan-out wires in the fanout region, and the larger space occupied by the fanout region. In addition, with gradually increasing resolution of display screens, occupied width of fan-out wires gradually increases, which makes it difficult to narrow a lower bezel, and a width of the lower bezel is about 2.0 mm for a long period.

A display substrate is provided in an exemplary embodiment of the present disclosure, in which the data connection line is located in the display region, which is referred to as Fanout in AA (FIAA for short). One end of each of a plurality of data connection lines is located in the display region and is correspondingly connected with one of a plurality of data signal lines in the display region, another end of each of the plurality of data connection lines extends to a bonding region and is correspondingly connected with an integrated circuit in the bonding region. Since oblique fan-out wirings are not necessary to the bonding region, the width of the fanout region is reduced, then the width of the lower bezel is effectively reduced.

In an exemplary implementation, the display substrate in the embodiment of the present disclosure may include a drive circuit layer disposed on the base substrate, a light emitting structure layer provided on a side of the drive circuit layer away from the base substrate, and an encapsulation structure layer disposed on a side of the light emitting structure layer away from the base substrate. In a direction parallel to the display substrate, the display substrate may include, at least, a display region, a bonding region on a side of the display region, and bezel regions on other sides of the display region. In an exemplary embodiment, a drive circuit layer in the display region may include a plurality of circuit units constituting a plurality of unit rows and a plurality of unit columns, and at least one of the circuit units may include a pixel drive circuit configured to output a corresponding current to a connected light emitting device. The light emitting structure layer in the display region may include a plurality of sub-pixels that constitute a pixel array, at least one of the sub-pixels may include a light emitting device that is connected with a pixel drive circuit of a corresponding circuit unit, and the light emitting device is configured to emit light at corresponding brightness in response to a current output by the connected pixel drive circuit.

In an exemplary embodiment, the sub-pixel in the present disclosure refers to a region classified according to a light emitting device, and a circuit unit in the present disclosure refers to a region classified according to a pixel drive circuit. In an exemplary embodiment, orthographic projections of the sub-pixels on the base substrate may correspond to orthographic projections of the circuit units on the base substrate, or the orthographic projections of the sub-pixels on the base substrate may not correspond to the orthographic projections of the circuit units on the base substrate.

In an exemplary embodiment, the display substrate in an exemplary embodiment of the present disclosure may include a drive circuit layer disposed on the base substrate that includes, at least, a first flexible layer, a second flexible layer and a base substrate conductive layer disposed between the first flexible layer and the second flexible layer, wherein the base substrate conductive layer includes, at least, a first connection line. The drive circuit layer at least includes a shielding conductive layer disposed on the base substrate and a functional conductive layer disposed on a side of the shielding conductive layer away from the base substrate, wherein the shielding conductive layer at least includes a second connection line, and the functional conductive layer includes, at least, a function signal line. The second connection line is connected with the first connection line through a first lap via, and the function signal line is connected with the second connection line through a second lap via.

In an exemplary embodiment, in a direction parallel to the display substrate, the drive circuit layer includes a plurality of circuit units, and at least one of the sub-pixels includes a pixel drive circuit that is connected with the function signal line.

In an exemplary embodiment, the function signal line includes a data signal line that provides a data signal to the pixel drive circuit.

In an exemplary embodiment, the function signal line includes a first power supply line that provides a power supply signal to the pixel drive circuit.

FIG. 6 is a schematic diagram of a planar structure of a display substrate according to an exemplary embodiment of the present disclosure, wherein data connection lines in the display substrate are of an FIAA structure. In a direction parallel to the display substrate, the display substrate may include a display region 100, a bonding region 200 on a side of the display region 100 in a second direction Y, and bezel regions 300 on other sides of the display region 100. The display region 100 may include, at least, a plurality of data signal lines 60 and a plurality of circuit units constituting a plurality of unit rows and a plurality of unit columns, and at least one of the circuit units may include, at least, a pixel drive circuit that is connected with the data signal lines 60. The bonding region 200 may include, at least, a lead region 201 and a bending region 202 that are disposed sequentially in a direction away from the display region 100. In an exemplary embodiment, the display substrate may further include a plurality of data connection lines. First ends of the plurality of data connection lines are correspondingly connected with an integrated circuit in the bonding region, and second ends of the plurality of data connection lines extend to the display region 100 across the bending region 202 and the lead region 201 and are correspondingly connected with the plurality of data signal lines 60.

In an exemplary embodiment, a plurality of circuit units sequentially disposed along a first direction X are referred to as unit rows, and a plurality of circuit units sequentially disposed along a second direction Y are referred to as unit columns. The plurality of unit rows and the plurality of unit columns form an array of circuit units arranged in an array, and the first direction X intersects with the second direction Y.

In an exemplary embodiment, the second direction Y may be an extension direction of the data signal line (vertical direction), and the first direction X may be perpendicular to the second direction Y (horizontal direction).

In an exemplary implementation, a main part of the data signal line 60 may be of a line shape extending along the second direction Y, a plurality of data signal lines 60 are sequentially disposed with a predefined interval in the first direction X, and each of the data signal lines 60 is connected with pixel drive circuits of circuit units in one pixel column.

In an exemplary embodiment, the data connection line may include a first connection line 70 and a second connection line 80 connected to each other.

In an exemplary embodiment, a first end of the first connection line 70 is connected with the integrated circuit in the bonding region. After extending to the lead region 201 through the bending region 202, a second end of the first connection line 70 is connected with a first end of the second connection line 80 through a first lap via DV1. After extending to the display region 100, a second end of the second connection line 80 is connected with the data signal line 60 through a second lap via DV2 to form a connection line structure in which the first lap via DV1 is provided in the lead region 201 and the second lap via DV2 is provided in the display region 100. In this way, the data signal lines 60 in the display region are connected with the integrated circuit in the bonding region through the data connection line including the first connection line 70 and the second connection line 80, so that the integrated circuit provides the data signal to the data signal line 60. In an exemplary embodiment, a plurality of first connection lines 70 in the lead region 201 and the bending region 202 may be parallel to each other and parallel to the data signal lines 60. Since a fan-shaped oblique line is not required in the bonding region, the width of the fanout region is reduced, and the width of the lower bezel can be effectively reduced.

In the present disclosure, "A extends in a B direction" means that A may include a main portion, which is a line, a line segment or a strip-shaped body, and a secondary portion connected with the main portion, the main portion extends in the B direction, and a length of the main portion extending in the B direction is greater than a length of the secondary portion extending in another direction. In the following description, "A extends in a B direction" means "the main part of A extends in a B direction". In an exemplary implementation, the second direction Y may be a direction pointing to the bonding region from the display region, and an opposite direction of the second direction Y may be a direction pointing to the display region from the bonding region.

In an exemplary implementation, a quantity of the data connection lines may be equal to a quantity of the data signal lines, or the quantity of the data connection lines may be less than the quantity of the data signal lines, which is not limited in the present disclosure.

In an exemplary implementation, the display region 100 can be classified into a first region 110 and second region 120 according to the presence or absence of the data connection lines. The first region 110 may be a region in which no data connection line 70 is provided, and the second region 120 may be a region in which a data connection line 70 is provided.

In an exemplary implementation, in the second direction Y, the second region 120 may be located on a side of the display region 100 in the second direction Y, that is, the second region 120 may be located at a position of the display region 100 close to the bonding region 200.

In some possible exemplary implementations, the second region 120 may be located in the middle of the display region in the second direction Y, or the second region 120 may be located at a position of the display region away from the bonding region, and the second region 120 may include at least one unit row, which is not limited in the present disclosure.

FIG. 7a is a schematic view of a structure of a data connection line according to an exemplary embodiment of the present disclosure, and is an enlarged view of the region C in FIG. 6, and FIG. 7b is a cross-sectional view taken along an A-A direction in FIG. 7a. As shown in FIG. 7, in a direction perpendicular to the display substrate, the display substrate may include, at least, the drive circuit layer 102 disposed on the base substrate 101. In an exemplary implementation, the base substrate 101 includes a first flexible layer 10A, a second flexible layer 10C and a base substrate conductive layer disposed between the first flexible layer 10A and the second flexible layer 10C, wherein the base substrate conductive layer may include, at least, a first connection line 70. The drive circuit layer 102 may include, at least, a shielding conductive layer disposed on the base substrate 101 and a functional conductive layer disposed on a side of the shielding conductive layer away from the base substrate. The shielding conductive layer may include, at least, a second connection line 80, and the functional conductive layer may include, at least, a function signal line. The second connection line 80 is connected with the first connection line 70 through the first lap via DV1, and the function signal line is connected with the second connection line 80 through the second lap via DV2.

In an exemplary implementation, the functional conductive layer may include, at least, a data signal line 60 served as a function signal line which is connected with the second connection line 80 through the second lap via DV2.

In another exemplary implementation, the functional conductive layer may include, at least, a first power supply line 44 served as a function signal line which is connected with the second connection line 80 through the second lap via DV2.

In an exemplary implementation, in a direction parallel to the display substrate, the drive circuit layer 101 may include a plurality of circuit units, and at least one of the circuit units may include a pixel drive circuit that may include, at least, a plurality of transistors and a storage capacitor, and the storage capacitor is connected, respectively, to a first power supply line 44 that supplies a power supply signal to the pixel drive circuit and a data signal line 60 that supplies a data signal to the pixel drive circuit.

In an exemplary implementation, the drive structure layer 102 may include a shielding conductive layer, a first insulation layer 91, a semiconductor layer, a second insulation layer 92, a first conductive layer, a third insulation layer 93, a second conductive layer, a fourth insulation layer 94 and a third conductive layer stacked in sequence on the base substrate 101. The shielding conductive layer may include, at least, a second connection line 80, the semiconductor layer may include, at least, an active layer of a plurality of transistors, the first conductive layer may include, at least, gate electrodes of a plurality of transistors and a first plate of the storage capacitor, the second conductive layer may include, at least, a second plate of the storage capacitor, the third conductive layer may serve as a functional conductive layer, and the third conductive layer may include, at least, a data signal line 60 and a first power supply line 44.

In an exemplary implementation, the base substrate 101 may further include a first barrier layer 10B and a second barrier layer 10D. The first barrier layer 10B is disposed between the first flexible layer 10A and a base substrate conductive layer, and the second barrier layer 10D is disposed at a side of the second flexible layer 10C away from the first flexible layer 10A.

In an exemplary implementation, the first lap via DV1 may be disposed on the second flexible layer 10C and the second barrier layer 10D, the second flexible layer 10C and the second barrier layer 10D in the first lap via DV1 are removed, exposing a surface of the first connection line 70. On an inner wall of the first lap via DV1, the second flexible layer 10C and the second barrier layer 10D are included, and the second connection line 80 connected to the first connection line 70 covers the inner wall of the first lap via DV1.

In an exemplary implementation, in a region where the first lap via DV1 is located, a plurality of inorganic layers are disposed on a side of the second connection line 80 connected with the first connection line 70 away from the base substrate 101, and the plurality of inorganic layers may include any one or more of the first insulation layer 91, the second insulation layer 92, the third insulation layer 93, and the fourth insulation layer 94.

In an exemplary implementation, the first lap via DV1 may be provided in the lead region 201, and the second lap via DV2 may be provided in the display region 100.

In an exemplary implementation, the lead region 201 includes an encapsulation region and a non-encapsulation region divided by an encapsulation line FX. The encapsulation region and the non-encapsulation region may be disposed sequentially in a direction away from the display region 100. A region on a side of the encapsulation line FX close to the display region 100 is an encapsulation region, and a region on a side of the encapsulation line FX away from the display region 100 is a non-encapsulation region. The first lap via DV1 may be provided in the non-encapsulation region in the lead region 201, that is, the first lap via DV1 may be disposed on the side of the encapsulation line FX away from the display region 100.

In an exemplary implementation, the base substrate in the bending region 202 in the bonding region includes only the first flexible layer 10A, the first barrier layer 10B, the base substrate conductive layer and the second flexible layer 10C that are stacked. That is, the second barrier layer 10D, the first insulation layer 91, the second insulation layer 92, the third insulation layer 93 and the fourth insulation layer 94 in the bending region 202 are removed.

Exemplary description is made below through a manufacturing process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a material on a base substrate through a process such as deposition, coating, etc. If the "thin film" does not need a patterning process in an entire manufacturing process, the "thin film" may also be called a "layer". If the "thin film" needs a patterning process in an entire manufacturing process, it is called a "thin film" before the patterning process, and called a "layer" after the patterning process. The "layer" after the patterning process includes at least one "pattern". "A and B being disposed on a same layer" mentioned in the present disclosure means that A and B are formed simultaneously through a same patterning process, and a "thickness" of a film layer is a dimension of the film layer in a direction perpendicular to a display substrate. In an exemplary implementation of the present disclosure, "an orthographic projection of B is within a range of an orthographic projection of A" or "an orthographic projection of A includes an orthographic projection of B" refers to that a boundary of the orthographic projection of B falls within a range of a boundary of the orthographic projection of A, or the boundary of the orthographic projection of A is overlapped with the boundary of the orthographic projection of B.

In an exemplary implementation, the region C in FIG. 6 is taken as an example, a manufacturing process of the display substrate according to the exemplary embodiment may include following operations.

(11) A base substrate is manufactured. In an exemplary implementation, manufacturing a base substrate may include: on a glass carrier plate, a layer of a first flexible material is coated at first, which is cured into film to form a first flexible layer. Then a block thin film and a base substrate conductive film are sequentially deposited on the first flexible layer 10A, and the base substrate conductive film is patterned by a patterning process to form a barrier layer 10B covering the first flexible layer 10A and a pattern of the base substrate conductive layer disposed on the first barrier layer 10B. A layer of second flexible material is then coated and cured into film to form a second flexible layer 10C covering the pattern of the base substrate conductive layer. Then a second barrier film is deposited to form a second barrier layer 10D covering the second flexible layer 10C as shown in FIGS. 8a and 8b, wherein FIG. 8b is a cross-sectional view taken along an A-A direction in FIG. 8a. In an exemplary implementation, the base substrate conductive layer may be referred to as a 0th source drain metal (SD0) layer.

In an exemplary implementation, the pattern of the base substrate conductive layer may include, at least, a plurality of first connection lines 70 disposed in the lead region 201 and the bending region 202.

In an exemplary implementation, a shape of the first connection line 70 may be a line in which a main part extends along the second direction Y, a first end of the first connection line 70 is connected with an integrated circuit in the bonding region, and the second end of the first connection line 70 extends to the lead region 201 across the bending region 202.

In an exemplary implementation, an end of the first connection line 70 close to the display region 100 (the second end of the first connection line 70) is provided with a first connection block 71 that may be a rectangle. The first connection block 71 and the first connection line 70 may be connected to each other to form an integral structure, and the first connection block 71 is configured to connect with a second connection line formed subsequently through a first lap via.

In an exemplary implementation, the first connection block 71 may be disposed on a side of the encapsulation line FX away from the display region, the encapsulation line FX is a boundary where the encapsulation structure layer covers the lead region 201. The lead region 201 includes an encapsulation region and a non-encapsulation region divided by an encapsulation line FX. The encapsulation region and the non-encapsulation region may be disposed sequentially in a direction away from the display region 100. A region on a side of the encapsulation line FX close to the display region 100 is an encapsulation region, and a region on a side of the encapsulation line FX away from the display region 100 is a non-encapsulation region.

In an exemplary implementation, a plurality of first connection lines 70 may be spaced along the first direction X, and positions of the plurality of first connection lines 70 may correspond to positions of unit columns in the display region 100.

In an exemplary implementation, after this process, the film layer in the bending region 202 in the bonding region includes the first flexible layer 10A, the first barrier layer 10B, the base substrate conductive layer, the second flexible layer 10C, and the second barrier layer 10D that are sequentially disposed on the glass carrier plate 1.

In an exemplary implementation, the material of the first flexible layer and the second flexible layer may include, but is not limited to, one or more of polyethylene glycol terephthalate, polyethylene terephthalate, polyether-ether-ketone, polystyrene, polycarbonate, polyarylate, polyarylester, polyimide, polyvinyl chloride, polyethylene, and textile fibers. The material of the first barrier layer and the second barrier layer may include, but is not limited to, one or more of a silicon oxide (SiOx), a silicon nitride (SiNx), and a silicon oxynitride (SiON), which may form a single layer, a multi-layer, or a composite layer for improving the water-oxygen resistance of the base substrate. The base substrate conductive layer may be made of a metal material, such as any one or more of silver (Ag), copper (Cu), aluminum (Al), and molybdenum (Mo), or an alloy material of the aforementioned metals. For example, the base substrate conductive layer may be molybdenum. For another example, the base substrate conductive layer may be in a titanium/aluminum/titanium (Ti/Al/Ti) composite structure.

In an exemplary implementation, the first barrier layer and the second barrier layer may be about 0.3 μm to 0.5 μm in thickness. For example, the first barrier layer may be about 0.4 μm in thickness, and the second barrier layer may be about 0.4 μm in thickness.

(12) A pattern of a first lap via is formed. In an exemplary implementation, forming the pattern of the first lap via may include patterning the second barrier layer and the second flexible layer by a patterning process to form a plurality of first lap via DV1, as shown in FIGS. 9a and 9b, wherein FIG. 9b is a cross-sectional view taken along a direction A-A in FIG. 9a.

In an exemplary implementation, a plurality of first lap vias DV1 may be provided in a non-encapsulation region within the lead region 201, that is, the first lap via DV1 may be provided on a side of the encapsulated line FX away from the display region 100.

In an exemplary implementation, an orthographic projection of the first lap via DV1 on the base substrate may be located within a range of an orthographic projection of the first connection block 71 on the base substrate, the second barrier layer and the second flexible layer in the first lap via DV1 is removed to expose a surface of the first connection block 71, a second flexible layer and a second barrier layer is included in an inner wall of the first lap via DV1 such that the first lap via DV1 is configured to connect the second connection line formed subsequently with the first connection block 71.

In an exemplary implementation, in a patterning process for forming a plurality of first lap vias DV1, the second barrier layer 10D in the bending region 202 is removed such that the second flexible layer 10C in the bending region is exposed.

In an exemplary implementation, after this process, the film layer in the bending region 202 in the bonding region includes the first flexible layer 10A, the first barrier layer 10B, the base substrate conductive layer and the second flexible layer 10C that are sequentially disposed on the glass carrier plate 1.

(13) A pattern of the shielding conductive layer is formed. In an exemplary implementation, the operation of forming the pattern of the shielding conductive layer may include: depositing a shielding thin film on the base substrate, patterning the shielding thin film by a patterning process, and forming the pattern of the shielding conductive layer on the second barrier layer, as shown in FIGS. 10a and 10b, and FIG. 10b is a cross-sectional view taken along a direction A-A in FIG. 10a.

In an exemplary implementation, the pattern of the shielding conductive layer may include, at least, a shielding electrode 50 disposed in the display region, and a second connection line 80 disposed in the display region and the lead region.

In an exemplary implementation, a shape of the shielding electrode 50 may be a rectangle, and the shielding electrode 50 may be disposed in each circuit unit in the display region 100, and is configured to shade at least one transistor of the pixel drive circuit to reduce the influence of light on the electrical characteristics of the transistor. Furthermore, the shielding electrode 50 may be configured to suppress the accumulation of electrons, which are generated by collision and ionization, within a channel and to weaken the accumulation of Joule heat within the channel.

In an exemplary implementation, the second connection line 80 may be of a line shape in which a main part extends in the second direction Y, and an end of the second connection line 80 away from the display region 100 (a first end of the second connection line 80) is provided with a second connection block 81, the second connection block 81 may be of a rectangular shape, and the second connection block 81 is connected with the first connection block 71 through the first lap via DV1. A second end of the second connection line 80 extends to the display region 100 and the second end of the second connection line 80 is configured to connect with a data signal line formed subsequently.

In an exemplary implementation, since the inner wall of the first lap via DV1 includes the second flexible layer 10C and the second barrier layer 10D, the second connection block 81 of the second connection line 80 covers the second flexible layer 10C and the second barrier layer 10D of the inner wall of the first lap via DV1.

In an exemplary implementation, after this process, the film layer in the bending region 202 in the bonding region includes the first flexible layer 10A, the first barrier layer 10B, the base substrate conductive layer and the second flexible layer 10C that are sequentially disposed on the glass carrier plate 1.

(14) A pattern of a semiconductor layer is formed. In an exemplary implementation, the operation of forming the pattern of the semiconductor layer may include: a first insulation thin film and a semiconductor thin film are sequentially deposited on a base substrate, the semiconductor thin film is patterned through a patterning process to form a first insulation layer 91 that covers the shielding conductive layer, and to form a pattern of a semiconductor layer disposed on the first insulation layer 91, as shown in FIGS. 11a and 11b, and FIG. 11b is a cross-sectional view along a direction A-A in FIG. 11a.

In an exemplary implementation, the pattern of the semiconductor layer of each circuit unit in the display region may include, at least, a first active layer 11 of the first transistor T1 to a seventh active layer 17 of the seventh transistor T7, and the first active layer 11 to the seventh active layer 17 are connected with each another to form an integral structure. In a second direction Y, a sixth active layer 16 in sub-pixels in a unit row and a seventh active layer 17 in sub-pixels in next row are connected with each other.

In an exemplary implementation, in a first direction X, the second active layer 12 and the sixth active layer 16 may be located on a same side of the third active layer 13 in the circuit unit, the fourth active layer 14 and the fifth active layer 15 may be located on a same side of the third active layer 13 in the circuit unit, and the second active layer 12 and the fourth active layer 14 may be located on different sides of the third active layer 13 of the circuit unit. In the second direction Y, the first active layer 11, the second active layer 12, and the fourth active layer 14, and the seventh active layer 17 in the sub-pixels of M-th row may be located on a side of the third active layer 13 in the circuit unit in a direction opposite to the second direction Y, and the fifth active layer 15 and the sixth active layer 16 may be located on a side of the third active layer 13 in the circuit unit in a second direction Y.

In an exemplary implementation, an orthographic projection of the third active layer 13 on the base substrate may be within a range of a orthographic projection of the shielding electrode 50 on the base substrate. The shielding electrode 50 may shade the third active layer 13 to reduce the influence of light on the electrical characteristics of the drive transistor.

In an exemplary implementation, the first active layer 11 may be in an "n" shape, the second active layer 12 and the fifth active layer 15 may be in a "L" shape, the third active layer 13 may be in an "Ω" shape, the fourth active layer 14, the fifth active layer 15, the sixth active layer 16 and the seventh active layer 17 may be in an "I" shape.

In an exemplary implementation, an active layer of each transistor may include a first region, a second region, and a channel region located between the first region and the second region. In an exemplary implementation, a first region 11-1 of the first active layer 11 may serve as a first region 17-1 of the seventh active layer 17; a second region 11-2 of the first active layer 11 may serve as a first region 12-1 of the second active layer 12; a first region 13-1 of the third active layer 13 may serve as a second region 14-2 of the fourth active layer 14 and a second region 15-2 of the fifth active layer 15 simultaneously; a second region 13-2 of the third active layer 13 may serve as a second region 12-2 of the second active layer 12 and a first region 16-1 of the sixth active layer 16 simultaneously; a second region 16-2 of the sixth active layer 16 may serve as a second region 17-2 of the seventh active layer 17; a first region 14-1 of the fourth active layer 14 and a first region 15-1 of the fifth active layer 15 may be separately provided.

In an exemplary implementation, the orthographic projection of the semiconductor layer on the base substrate is not overlapped with the orthographic projection of the second connection line 80 on the base substrate.

In an exemplary implementation, the first insulation layer may be about 0.3 μm to 0.5 μm in thickness. For example, the first insulation layer may be about 0.4 μm in thickness.

In an exemplary implementation, after this process, the film layer in the bending region 202 in the bonding region includes the first flexible layer 10A, the first barrier layer 10B, the base substrate conductive layer, the second flexible layer 10C and the first insulation layer 91 that are sequentially disposed on the glass carrier plate 1.

(15) A pattern of a first conductive layer is formed. In an exemplary implementation, the operation of forming the pattern of the second semiconductor layer may include: a second insulation thin film and a first conductive thin film are sequentially deposited on the base substrate on which the aforementioned patterns are formed, and the first conductive thin film is patterned by a patterning process to form a second insulation layer 92 covering the pattern of the semiconductor layer, and a pattern of a first conductive layer disposed on the second insulation layer 92, as shown in FIGS. 12a and 12b, wherein FIG. 12b is a cross-sectional view taken along an A-A direction in FIG. 12a. In an exemplary implementation, the first conductive layer may be referred to as a first gate metal (GATE1) layer.

In an exemplary implementation, the pattern of the first conductive layer of each circuit unit in the display region may include, at least, the first scanning signal line 21, the second scanning signal line 22, the light emitting control line 23, the first plate 24 of the storage capacitor.

In an exemplary implementation, the first plate 24 may be in a shape of a rectangle, and chamfers may be provided at corners of the rectangle. An orthographic projection of the first plate 24 on the base substrate is at least partially overlapped with an orthographic projection of the third active layer of the third transistor T3 on the base substrate. In an exemplary implementation, the first plate 24 may serve as a plate of the storage capacitor and a gate electrode of the third transistor T3 simultaneously.

In an exemplary implementation, the first scanning signal line 21 may be of a line shape in which a main part extends along the first direction X, and the first scanning signal line 21 may be located on a side of the first plate 24 of the circuit unit in an opposite second direction Y. The first scanning signal line 21 of each circuit unit is provided with a gate block 21-1, a first end of the gate block 21-1 is connected with the first scan signal line 21, and a second end of the gate block 21-1 extends towards a direction away from the first plate 24. A region where the first scan signal line 21 and the gate block 21-1 are overlapped with the second active layer of the circuit unit serves as a gate electrode of the second transistor T2 of a double-gate structure, and a region where the first scan signal line 21 is overlapped with the fourth active layer of the circuit unit serves as a gate electrode of the fourth transistor T4.

In an exemplary implementation, the second scan signal line 22 may be of a line shape in which a main part extends along the first direction X, the second scan signal line 22 may be located on a side of the first scan signal line 21 of the circuit unit away from the first plate 24, a region where the second scan signal line 22 is overlapped with the first active layer of the circuit unit serves as a gate electrode of the first transistor T1 in a double-gate structure, and a region where the second scan signal line 22 is overlapped with the seventh active layer of the circuit unit serves as a gate electrode of the seventh transistor T7.

In an exemplary implementation, the light emitting control line 23 may be of a line shape in which a main part extends along the first direction X, the light emitting control line 23 may be located on a side of the first plate 24 of the circuit unit in the second direction Y, a region where the light emitting control line 23 is overlapped with the fifth active layer of the circuit unit serves as a gate electrode of the fifth transistor T5, and a region where the light emitting control line 23 is overlapped with the sixth active layer of the circuit unit serves as a gate electrode of the sixth transistor T6.

In an exemplary implementation, the first scan signal line 21, the second scan signal line 22, and the light emitting control line 23 may be in an equal width design, or may be in a non-equal width design, may be straight lines, or may be polygonal lines, which may not only facilitate the layout of the pixel structure, but also reduce the parasitic capacitance between the signal lines, and this is not limited in the present disclosure.

In an exemplary implementation, the second insulation layer may be about 0.1 μm to 0.2 μm in thickness. For example, the second insulation layer may be about 0.12 μm in thickness.

In an exemplary implementation, after the pattern of the first conductive layer is formed, the semiconductor layer may be subjected to a conductive treatment by using the first conductive layer as a shield. A region of the semiconductor layer, which is shielded by the first conductive layer, forms channel regions of the first transistor T1 to the seventh transistor T7, and a region of the semiconductor layer, which is not shielded by the first conductive layer, is made to be conductive, that is, first regions and second regions of the first transistor T1 to the seventh active layer are all made to be conductive.

In an exemplary implementation, after this process, the film layer in the bending region 202 in the bonding region includes the first flexible layer 10A, the first barrier layer 10B, the base substrate conductive layer, the second flexible layer 10C, the first insulation layer 91 and the second insulation layer 92 that are sequentially disposed on the glass carrier plate 1.

(16) A pattern of a second conductive layer is formed. In an exemplary implementation, the operation of forming the pattern of the second conductive layer may include: a third insulation thin film and a second conductive thin film are sequentially deposited on the base substrate on which the aforementioned patterns are formed, and the second conductive thin film is patterned by a patterning process to form a third insulation layer 93 covering the first conductive layer, and the pattern of the second conductive layer is disposed on the third insulation layer 93 as shown in FIGS. 13a and 13b, wherein FIG. 13b is a cross-sectional view taken along an A-A direction in FIG. 13a. In an exemplary implementation, the second conductive layer may be referred to as a second gate metal (GATE2) layer.

In an exemplary implementation, the pattern of the second conductive layer of each sub-pixel in the display region includes, at least, an initial signal line 31, a second plate 32 of the storage capacitor, and a plate connection line 33.

In an exemplary implementation, a profile of the second electrode plate 32 may be a rectangle, corners of the rectangle may be provided with a chamfer. An orthographic projection of the second plate 32 on the base substrate is at least partially overlapped with an orthographic projection of the first plate 24 on the base substrate. The second plate 32 may serve as another plate of the storage capacitor, and the first plate 24 and the second plate 32 form the storage capacitor of the pixel drive circuit. The second plate 32 is provided with an opening 34 which may be an rectangle and may be located in the middle of the second plate 32, so that the second plate 32 is annular. The opening 34 exposes the third insulation layer covering the first plate 24, and the orthographic projection of the first plate 24 on the base substrate contains an orthographic projection of the opening 34 on the base substrate. In an exemplary implementation, the opening 34 is configured to accommodate a first via formed subsequently, which is located in the opening 34 and exposes the first plate 24, so that a second electrode of the first transistor T1 formed subsequently is connected with the first plate 24.

In an exemplary implementation, the second plates 32 of two adjacent sub-pixels in one unit row are connected with each other by a plate connection line 33. For example, the second plate 32 of the (N−1)th column and the second plate 32 of the N-th column may be connected with each other by the plate connection line 33. As another example, the second plate 32 of the N-th row and the second plate 32 of the (N+1)th row are connected with each other by the plate connection line 33. In an exemplary implementation, since the second plate 32 in each circuit unit is connected with a first power supply line formed subsequently, second plates 32 in adjacent circuit units are connected with each other to form an integral structure in which the second plates may be used as power supply signal lines as well, and ensure potential equalization between a plurality of second plates in one unit row, which is beneficial to improving uniformity of a panel and avoiding a poor display of the display substrate, thereby ensuring a display effect of the display substrate.

In an exemplary implementation, the initial signal line 31 may be of a line shape in which a main part extends along the first direction X. The initial signal line 31 may be located on a side of the second scan signal line 22 of the circuit unit away from the first scan signal line 21, and the initial signal line 31 is configured to connect with a first electrode of the first transistor T1 formed subsequently (also a first electrode of the seventh transistor T7).

In an exemplary implementation, the third insulation layer may be about 0.1 μm to 0.2 μm in thickness. For example, the third insulation layer may be about 0.13 μm in thickness.

In an exemplary implementation, after this process, the film layer in the bending region 202 in the bonding region includes the first flexible layer 10A, the first barrier layer 10B, the base substrate conductive layer, the second flexible layer 10C, the first insulation layer 91, the second insulation layer 92 and the third insulation layer 93 that are sequentially disposed on the glass carrier plate 1.

(17) A pattern of a fourth insulation layer is formed. In an exemplary implementation, the operation of forming the pattern of the fourth insulation layer may include: a fourth insulation thin film is deposited on the base substrate on which the aforementioned patterns are formed, the fourth insulation thin film is patterned by a patterning process to form a fourth insulation layer 94 covering the second conductive layer, and a plurality of vias are disposed on the fourth insulation layer 94, as shown in FIG. 14a and FIG. 14b, wherein FIG. 14b is a cross-sectional view taken along a direction A-A in FIG. 14a.

In an exemplary implementation, the plurality of vias of each circuit unit in the display region include, at least, a first via V1, a second via V2, a third via V3, a fourth via V4, a fifth via V5, a sixth via V6, a seventh via V7, an eighth via V8 and a second lap via DV2.

In an exemplary implementation, an orthographic projection of the first via V1 on the base substrate is within a range of an orthographic projection of the opening 34 on the base substrate, the fourth insulation layer and the third insulation layer in the first via V1 are etched away to expose a surface of the first plate 24, and the first via V1 is configured such that the second electrode of the first transistor T1 formed subsequently (also the first electrode of the second transistor T2) is connected with the first plate 24 through the via V1.

In an exemplary implementation, an orthographic projection of the second via V2 on the base substrate is within a range of an orthographic projection of the second plate 32 on the base substrate, the fourth insulation layer in the second via V2 is etched away to expose a surface of the second plate 32, and the second via V2 is configured such that the first power supply line formed subsequently is connected with the second plate 32 through the via V2. In an exemplary implementation, there may be a plurality of second vias V2, and the plurality of second vias V2 may be disposed in sequence along the second direction Y to improve connection reliability.

In an exemplary implementation, an orthographic projection of the third via V3 on the base substrate is within a range of an orthographic projection of the first region of the fifth active layer on the base substrate. The fourth insulation layer, the third insulation layer and the second insulation layer in the third via V3 are etched away to expose a surface of the first region of the fifth active layer, and the third via V3 is configured such that the first power supply line formed subsequently is connected with the first region of the fifth active layer through the via V3.

In an exemplary implementation, an orthographic projection of the fourth via V4 on the base substrate is within a range of an orthographic projection of the second region of the sixth active layer (also the second region of the seventh active layer) on the base substrate. The fourth insulation layer, the third insulation layer and the second insulation layer in the fourth via V4 are etched away to expose a surface of the second region of the sixth active layer, and the fourth via V4 is configured such that the second electrode of the sixth transistor T6 formed subsequently (also the second electrode of the seventh transistor T7) is connected with the second region of the sixth active layer through the via V4.

In an exemplary implementation, an orthographic projection of the fifth via V5 on the base substrate is within a range of an orthographic projection of the first region of the fourth active layer on the base substrate. The fourth insulation layer, the third insulation layer and the second insulation layer in the fifth via V5 are etched away to expose a surface of the first region of the fourth active layer, and the fifth via V5 is configured such that the data signal line formed subsequently is connected with the first region of the fourth active layer through the via V5.

In an exemplary implementation, an orthographic projection of the sixth via V6 on the base substrate is within a range of an orthographic projection of the second region of the first active layer (also the first region of the second active layer) on the base substrate. The fourth insulation layer, the third insulation layer and the second insulation layer in the sixth via V6 are etched away to expose a surface of the second region of the first active layer, the sixth via V6 is configured such that the second electrode of the first transistor T1 formed subsequently (also the first electrode of the second transistor T2) is connected with the second region of the first active layer (also the first region of the second active layer) through the via V6.

In an exemplary implementation, an orthographic projection of the seventh via V7 on the base substrate is within a range of an orthographic projection of the first region of the first active layer (also the first region of the seventh active layer) on the base substrate. The fourth insulation layer, the third insulation layer and the second insulation layer in the seventh via V7 are etched away to expose a surface of the first region of the first active layer, the seventh via V7 is configured such that the first electrode of the first transistor T1 formed subsequently (also the first electrode of the seventh transistor T7) is connected with the first region of the first active layer (also the first region of the seventh active layer) through the via V7.

In an exemplary implementation, an orthographic projection of the eighth via V8 on the base substrate is within a range of an orthographic projection of the initial signal line 31 on the base substrate. The fourth insulation layer in the eighth via V8 are etched away to expose a surface of the initial signal line 31, and the eighth via V8 is configured such that the first electrode of the first transistor T1 formed subsequently (also the first electrode of the seventh transistor T7) is connected with the initial signal line 31 through the via V8.

In an exemplary implementation, an orthographic projection of the second lap via DV2 on the base substrate is within a range of an orthographic projection of a second end of the second connection line 80 on the base substrate, the fourth insulation layer, the third insulation layer, the second insulation layer and the first insulation layer in the second lap via DV2 is etched away to expose a surface of a second end of the second connection line 80, and the second lap via DV2 is configured such that the data signal line formed subsequently is connected with the second connection line 80 through the via DV2.

In an exemplary implementation, the orthographic projection of the second lap via DV2 on the base substrate is not overlapped with an orthographic projection of the first lap via on the base substrate.

In an exemplary implementation, since the first insulation layer 91, the second insulation layer 92, the third insulation layer 93 and the fourth insulation layer 94 are sequentially deposited in the first lap via DV1 in steps (14) to (17), a plurality of inorganic layers are formed on the second connection line 80 in a region where the first lap via DV1 is located, so that not only a quality of an inorganic layer at an edge of a deep hole can be improved, but also the water-oxygen resistance ability of the deep hole can be improved to make good water-oxygen isolation, thus having a longer reliable working life of the display apparatus.

In an exemplary implementation, the plurality of inorganic layers on the second connection line 80 in the first lap via may include any one or more of the first insulation layer 91, the second insulation layer 92, the third insulation layer 93, and the fourth insulation layer 94.

In an exemplary implementation, in a patterning process in which a plurality of vias are formed, the fourth insulation layer 94, the third insulation layer 93, the second insulation layer 92, and the first insulation layer 91 of the bending region 202 in the bonding region are simultaneously removed so that the second flexible layer 10C in the bending region is exposed.

In an exemplary implementation, after this process, the film layer in the bending region 202 in the bonding region includes the first flexible layer 10A, the first barrier layer 10B, the base substrate conductive layer and the second flexible layer 10C that are sequentially disposed on the glass carrier plate 1.

(18) A pattern of a third conductive layer is formed. In an exemplary implementation, the operation of forming the third conductive layer may include: a third conductive thin film is deposited on the base substrate on which aforementioned patterns are formed, and the third conductive thin film is patterned by a patterning process to form a third conductive layer disposed on the fourth conductive layer, as shown in FIGS. 15a and 15b, wherein FIG. 15b is a cross-sectional view along a direction A-A in FIG. 15a. In an exemplary implementation, the third conductive layer may be referred to as a first source drain metal (SD1) layer.

In an exemplary implementation, the third conductive layer of each circuit unit in the display region includes, at least, a first connection electrode 41, a second connection electrode 42, a third connection electrode 43, a first power supply line 44, and a data signal line 60.

In an exemplary implementation, the first connection electrode 41 may be of a straight line shape in which a main part extends along the second direction Y. The first end of the first connection electrode 41 is connected with the first plate 24 through the first via V1, and the second end of the first connection electrode 41 is connected with the second region of the first active layer (also the first region of the second active layer) through the sixth via V6, so that the first plate 24, the second region of the first active layer and the first region of the second active layer have same potential. In an exemplary implementation, the first connection electrode 41 may serve as the second electrode of the first transistor T1 and the first electrode of the second transistor T2 simultaneously.

In an exemplary implementation, the second connection electrode 42 may be of a bending line shape in which a main part extends along the second direction Y. A first end of the second connection electrode 42 is connected with the initial signal line 31 through the eighth via V8, and a second end of the second connection electrode 42 is connected with the first region of the first active layer (also a first region of the seventh active layer) through the seventh via V7. In an exemplary implementation, the second connection electrode 42 may serve as the first electrode of the first transistor T1 and the first electrode of the seventh transistor T7 simultaneously.

In an exemplary implementation, the third connection electrode 43 may be of a block shape, and the third connection electrode 43 is connected with the second region of the sixth active layer (also the second region of the seventh active layer) through the fourth via V4. In an exemplary implementation, the third connection electrode 43 may serve as the second electrode of the sixth transistor T6 and the second electrode of the seventh transistor T7 simultaneously, and the third connection electrode 43 is configured to be connected with an anode connection electrode formed subsequently.

In an exemplary implementation, the first power supply line 44 may be of a straight line shape of which the main part extends along the second direction Y. On one hand, the first power supply line 44 is connected with the second plate 32 through the second via V2. On the other hand, the first power supply line 44 is connected with the first region of the fifth active layer through the third via V3. In this way, a power supply signal is written to the first electrode of the fifth transistor T5, and the second plate 32 and the first electrode of the fifth transistor T5 have the same potential.

In an exemplary implementation, the data signal line 60 may be of a straight line shape in which a main part extends along the second direction Y. On one hand, the data signal line 60 is connected with a first region of the fourth active layer through the fifth via V5, such that a data signal is written to the first electrode of the fourth transistor T4. On the other hand, the data signal line 60 is connected with the second connection line 80 through the second lap via DV2. Since the second connection line 80 is connected with the first connection line 70 through the first lap via, the data signal line 60 in the display region 100 is connected with the integrated circuit in the bonding region through the first connection line 70 and the second connection line 80.

In another exemplary implementation, in a solution in which the first power supply line 44 serves as a function signal line, the first power supply line 44 may be connected with the second connection line 80 through the second lap via DV2, and the data signal line 60 is not connected with the second connection line 80.

In an exemplary implementation, after this process, the film layer in the bending region 202 in the bonding region includes the first flexible layer 10A, the first barrier layer 10B, the base substrate conductive layer and the second flexible layer 10C that are sequentially disposed on the glass carrier plate 1.

The subsequent manufacturing process may include forming a first planarization layer, forming a fourth conductive layer, forming a second planarization layer and the like, and the drive circuit layer is manufactured on the glass carrier plate.

In an exemplary implementation, in a patterning process for forming the first planarization layer, the fourth conductive layer, and the second planarization layer, the first planarization layer, the fourth conductive layer, and the second planarization layer in the bonding region 202 are removed such that the bending region still exposes the second flexible layer 10C.

In an exemplary embodiment, in a direction parallel to the display substrate, the drive circuit layer in the display region may include a plurality of circuit units, each of which may include a pixel drive circuit that is connected with a first scan signal line 21, a second scan signal line 22, a light emitting control line 23, an initial signal line 31, a first power supply line, 44 and a data signal line 60, respectively. The drive circuit layer in the bonding region may include a plurality of first connection lines 70 and a plurality of second connection lines 80, and the second connection lines 80 are connected with the first connection lines 70 through the first lap via DV1.

In an exemplary embodiment, in a direction perpendicular to the display substrate, the drive circuit layer may be disposed on the base substrate, and the base substrate may include a first flexible layer 10A, a first barrier layer 10B, a base substrate conductive layer 10C and a second barrier layer 10D which are stacked, and the base substrate conductive layer may include, at least, a first connection line 70 in the bonding region. The drive circuit layer may include, at least, a shielding conductive layer, a first insulation layer 91, a semiconductor layer, a second insulation layer 92, a first conductive layer, a third insulation layer 93, a second conductive layer, a fourth insulation layer 94 and a third conductive layer stacked in sequence on the base substrate. The shielding conductive layer may include, at least, a second connection line 80 located in the display region and the bonding region, and the second connection line 80 is connected with the first connection line 70 through the first lap via DV1. The semiconductor layer may include, at least, active layers of the first transistor to the seventh transistor, wherein the first conductive layer includes, at least, the first scan signal line 21, the second scan signal line 22, the light emitting control line 23 and the first plate 24 of the storage capacitor. The second conductive layer may include, at least, the initial signal line 31, the second plate of the storage capacitor 32, and the plate connection line 33. The third conductive layer may include, at least, the first connection electrode 41, the second connection electrode 42, the third connection electrode 43, the first power supply line 44 and the data signal line 60, wherein the data signal line 60 is connected with the second connection line 80 through the second lap via DV2.

In an exemplary implementation, the shielding conductive layer, the first conductive layer, the second conductive layer, and the third conductive layer may be made of a metal material, for example, any one or more of Argentum (Ag), Copper (Cu), Aluminum (Al), and Molybdenum (Mo), or an alloy material of the above-mentioned metals, for example, an Aluminum-Neodymium alloy (AlNd) or a Molybdenum-Niobium alloy (MoNb), and may be in a single-layer structure, or in a multilayer composite structure such as Mo/Cu/Mo, etc. The first insulation layer, the second insulation layer, the third insulation layer, and the fourth insulation layer may be made of any one or more of silicon oxide (SiOx), silicon nitride (SiNx), and silicon oxynitride (SiON), and may be single-layer, multilayers, or composite layer. The first insulation layer may be referred to as a buffer layer, the second insulation layer and the third insulation layer may be referred to as Gate Insulator (GI) layers, and the fourth insulation layer may be referred to as an Interlayer Dielectric (ILD) layer. The semiconductor layer may be made of materials such as amorphous indium gallium zinc oxide (a-IGZO), zinc oxynitride (ZnON), indium zinc tin oxide (IZTO), amorphous silicon (a-Si), polysilicon (p-Si), hexathiophene, or polythiophene. That is, the embodiment of the present disclosure is applicable to thin film transistors that are manufactured based on oxide technology, silicon technology or organic technology.

In an exemplary implementation, after the drive circuit layer is manufactured, a light emitting structure layer and an encapsulation structure layer are manufactured on the drive circuit layer.

In an exemplary implementation, the operation of manufacturing the light emitting structure layer may include an anode conductive layer being formed at first, wherein the anode conductive layer may include, at least, a plurality of anode patterns. Then a pixel definition layer is formed, and the pixel definition layer of each circuit unit is provided with an opening in which the pixel definition layer is removed to expose an anode of the circuit unit where the pixel definition layer is located. Subsequently, an organic light emitting layer is formed using an evaporation or ink-jet printing process, and a cathode is formed on the organic light emitting layer.

In an exemplary implementation, in the patterning process for forming the light emitting structure layer, the anode conductive layer and the pixel defining layer of the bending region 202 in the bonding region are removed, and the bending region 202 is not evaporated with the organic light emitting layer and the cathode, so that the second flexible layer 10C in the bending region is exposed.

In an exemplary embodiment, the encapsulation structure layer may include a first encapsulation layer, a second encapsulation layer, and a third encapsulation layer that are stacked. The first encapsulation layer and the third encapsulation layer may be made of an inorganic material, and the second encapsulation layer may be made of an organic material. The second encapsulation layer is provided between the first encapsulation layer and the third encapsulation layer to ensure that external water and oxygen cannot enter the light emitting structure layer.

In an exemplary implementation, the encapsulation structure layer may be formed in the display region and the lead region, and the encapsulation structure layer in the lead region may be located on the side of the encapsulation line FX close to the display region.

As can be seen from the structure and the manufacturing process of the display substrate described above, in the display substrate provided in the present disclosure, a base substrate conductive layer is disposed between two flexible layers of the base substrate, the base substrate conductive layer includes the first connection line, and the first connection line is connected with the data signal line through the second connection line, thus data trace in the display region is achieved, which may reduce the width of the lower bezel and is beneficial to achieving a full-screen display.

In a display substrate of an FIAA structure, although a base substrate conductive layer is provided on the base substrate, the second conductive layer is connected with the base substrate conductive layer through the lap via. A study suggests that, a deep lap via in the structure, a digging film layer including the second flexible layer, the second barrier layer, the first insulation layer, the second insulation layer and the third insulation layer, and the lap via of about 5 μm to 8 μm in depth, not only makes the second conductive layer in the lap via difficult to process due to steep inner wall climbing, but also makes the second conductive layer likely break, resulting in Gate-drain Short circuit (GDS) black dot failure in a reliability test. In addition, the inner wall of the lap via is only covered with the second conductive layer and the fourth insulation layer. Because only the fourth insulation layer isolates water and oxygen, the water-oxygen isolation in the lap via region is not reliable, which easily leads to encapsulation failure and affects the reliable working life of the display apparatus.

According to the display substrate provided in the exemplary embodiments of the present disclosure, the shielding conductive layer is connected with the base substrate conductive layer through the first lap via, the digging film layer includes a second flexible layer and a second barrier layer, such that the depth of the first lap via is effectively reduced, and the depth of the first lap via can be reduced by about 1 μm, which not only reduces the process difficulty, but also improves the connection quality of the second connection line connecting the first connection line through the first lap via, effectively avoids black dot failure in the reliability test, and improves the product yield. Because the display substrate usually includes a shielding conductive layer, the solution of connecting by the shielding conductive layer not only does not add a new film layer, but also use a developed process, which can be well compatible with the existing manufacturing process, and the process is simple to achieve, easy to implement, high in production efficiency, low in production cost and high in yield.

According to the display substrate provided in the exemplary embodiments of the present disclosure, the shielding conductive layer is used to connect the base substrate conductive layer, and a plurality of inorganic layers formed subsequently fill the first lap via, so that the inner wall of the second flexible layer in the first lap via is covered with the shielding conductive layer, the first insulation layer, the second insulation layer, the third insulation layer and the fourth insulation layer. Isolation provided by the first insulation layer, the second insulation layer, the third insulation layer and the fourth insulation layer can not only improve the quality of the inorganic layer at the edge of the deep hole, but also the water-oxygen resistance ability can be improved. The improved water-oxygen resistance ability prolongs the reliable working life of the display apparatus.

According to the display substrate provided in the exemplary embodiments of the present disclosure, the first lap via connecting the first connection line and the second connection line is disposed on the side of the encapsulation line far away from the display region, not only the influence of the first lap via on the encapsulation quality can be reduced, but also the difficulty of the encapsulation process can be effectively reduced, the risk on the encapsulation reliability can be effectively reduced, and the process quality can be improved.

In the display substrate of the FIAA structure, a film layer of the bending region generally includes, at least, a first flexible layer, a first barrier layer, a second flexible layer, a second barrier layer, a third conductive layer (SD1), a planarization layer and a pixel definition layer, and the third conductive layer serves as a signal transmission line. Since the third conductive layer cannot be directly deposited on the second flexible layer, a second barrier layer needs to be provided between the second flexible layer and the third conductive layer, and the formed third conductive layer needs protection, so a planarization layer and a pixel defining layer need to be provided on the third conductive layer. A study suggests that, overall thickness of the bending region is larger because of more film layers in the bending region, which not only leads to a larger bending radius, but also cracks appear in brittle second barrier layer, planarization layer and pixel definition layer during bending. According to the display substrate provided in the exemplary embodiments of the present disclosure, the base substrate conductive layer serves as a signal transmission line, such that the film layer in the bending region only includes a first flexible layer, a first barrier layer, a base substrate conductive layer and a second flexible layer, and less film layers are in the bending region, which effectively reduces the overall thickness of the bending region, not only minimizing the bending radius which is beneficial to reducing the width of the bezel, but also avoids cracks in the film layer and improves the product quality.

FIG. 16 is a schematic diagram of a planar structure of another display substrate according to an exemplary embodiment of the present disclosure, wherein data connection lines in the display substrate are of a FIAA structure. As shown in FIG. 16, a main part of the structure of the display substrate in the exemplary embodiment is substantially similar to the structure shown in FIG. 6, except that the main part of the structure in the exemplary embodiment is a connection line structure in which both the first lap via DV1 and the second lap via DV2 are provided in the display region 100.

In an exemplary embodiment, the first end of the first connection line 70 is connected with the integrated circuit in the bonding region. After extending to the display region 100 through the lead region 201 and the bending region 202, the second end of the first connection line 70 is connected with the first end of the second connection line 80 through the first lap via DV1. After extending to a direction which is away from the lead region 201, a second end of the second connection line 80 is connected with the data signal line 60 through the second lap via DV2. In an exemplary embodiment, a plurality of first connection lines 70 in the lead region 201 may be parallel to each other. Since a fan-shaped oblique line is not required in the bonding region, the width of the fanout region is reduced, and the width of the lower bezel can be effectively reduced.

FIG. 17 is a schematic diagram of a structure of another data connection line according to an exemplary embodiment of the present disclosure, and is an enlarged view of a region D in FIG. 16. As shown in FIG. 17, in the display substrate according to the exemplary embodiment, the first connection line 70 is disposed at the base substrate conductive layer, the second connection line 80 is disposed at the shielding conductive layer, and the second connection line 80 is connected to the first connection line 70 through the first lap via DV1. When the first power supply line 44 serves as a function signal line, the first power supply line 44 is connected with the second connection line 80 through the second lap via DV2. When the data signal line 60 serves as a function signal line, the data signal line 60 is connected with the second connection line 80 through the second lap via DV2.

In an exemplary embodiment, both the first lap via DV1 and the second lap via DV2 may be disposed in the display region 100, the first lap via DV1 may be disposed in a unit row adjacent to the lead region 201 in the display region 100, and the second lap via DV2 may be disposed on the side of the first lap via DV1 away from the lead region 201.

In an exemplary implementation, the second connection line 80 may include, at least, a second connection block, a first sub-line and a second sub-line, wherein the connection block is connected with the first connection line through the first lap via, a first end connection block of the first sub-line is connected, a second end of the first sub-line is connected with the first end of the second sub-line after extending in an opposite direction of the first direction, and the second end of the second sub-line is connected with the function signal line through the second lap via after extending in an opposite direction of the second direction.

In an exemplary implementation, there is a first distance L1 between an edge of the first lap via on the side close to the second sub-line and an edge of the second sub-line on the side close to the first lap via, the first distance L1 may be about 0.1 M1 to 0.5 M1, and M1 is a length of the circuit unit in the first direction X.

In an exemplary implementation, there is a second distance L2 between an edge of the second lap via on the side close to the first sub-line and the edge of the first sub-line on the side close to the second lap via, wherein the second distance L2 may be about 0.2 M2 to 1.2 M2, and M2 is the length of the circuit unit in the second direction Y.

In an exemplary implementation, the region D in FIG. 16 is taken as an example, the manufacturing process of the display substrate according to the exemplary embodiment may include following operations.

(21) A base substrate is manufactured. In an exemplary embodiment, the process of manufacturing the base substrate may be substantially the same as the step (11) in the aforementioned embodiment, and the base substrate may include a first flexible layer, a first barrier layer, a base substrate conductive layer, a second flexible layer and a second barrier layer stacked on a glass carrier plate, as shown in FIG. 18.

In an exemplary implementation, the pattern of the base substrate conductive layer may include, at least, a plurality of first connection lines 70 disposed in the display region 100, the lead region 201 and the bending region 202.

In an exemplary implementation, the first connection line 70 may include, at least, a first connection block 71, a third sub-line 70-3 and a fourth sub-line 70-4. The third sub-line 70-3 may be of a line shape in which a main part extends in the second direction Y, wherein the first end of the third sub-line 70-3 is connected with the integrated circuit in the bonding region, and the second end of the third sub-line 70-3 is connected with the first end of the fourth sub-line 70-4 after passing through the bending region 202 and the lead region 201 and extending to the display region 100. The fourth sub-line 70-4 may be of a line shape in which a main part extends along the first direction X, wherein the first end of the fourth sub-line 70-4 is connected with the second end of the third sub-line 70-3, and the second end of the fourth sub-line 70-4 is connected with the first connection block 71 after extending along the first direction X. The first connection block 71 may be a rectangle, and the first connection block 71, the third sub-line 70-3, and the fourth sub-line 70-4 may be connected to each other to form an integral structure. The first connection block 71 is configured to connect with the second connection line formed subsequently through a first lap via.

(22) A pattern of a first lap via is formed. In an exemplary implementation, the process of forming the pattern of the first lap via may be substantially the same as step (12) in the aforementioned embodiment, as shown in FIG. 19.

In an exemplary implementation, a plurality of first lap vias DV1 may be disposed in the display region 100, an orthographic projection of the first lap via DV1 on the base substrate may be located within a range of an orthographic projection of the first connection block 71 on the base substrate, the second barrier layer and the second flexible layer in the first lap via DV1 is removed to expose a surface of the first connection block 71, the first lap via DV1 is configured to connect the second connection line formed subsequently with the first connection block 71.

(23) A pattern of the shielding conductive layer is formed. In an exemplary implementation, the process of forming the pattern of the shielding conductive layer may be substantially the same as step (13) in the aforementioned embodiment, as shown in FIG. 20.

In an exemplary implementation, the shielding conductive layer may include, at least, the shielding electrode 50 and the second connection line 80 disposed in the display region, and the structure of the shielding electrode 50 may be substantially the same as that of the shielding electrode 50 formed in step (13) in the aforementioned embodiment.

In an exemplary implementation, the second connection line 80 may include, at least, a second connection block 81, a first sub-line 80-1 and a second sub-line 80-2. The second connection block 81 may be a rectangle and is connected with the first connection block 71 through the first lap via DV1. A first end of the first sub-line 80-1 is connected with the second connection block 81, a second end of the first sub-line 80-1 is connected with a first end of the second sub-line 80-2 after extending in an opposite direction of the first direction X, a second end of the second sub-line 80-2 extends in an opposite direction of the second direction Y, and the second end of the second sub-line 80-2 is configured to connect with the data signal line formed subsequently.

In an exemplary implementation, an extension length of the second sub-line 80-2 may be greater than that of the first sub-line 80-1.

In an exemplary implementation, there is a first distance L1 between an edge of the first lap via DV1 on the side close to the second sub-line 80-2 and an edge of the second sub-line 80-2 on the side close to the first lap via DV1, the first distance L1 may be about 0.1 M1 to 0.5 M1, and M1 is a length of the circuit unit in the first direction X.

In an exemplary implementation, the first distance L1 may be about 6 μm to 30 μm. For example, the first distance L1 may be about 10 μm.

(24) Patterns of the semiconductor layer, the first conductive layer and the second conductive layer are formed in turn. In an exemplary implementation, the process of forming the patterns of the semiconductor layer, the first conductive layer and the second conductive layer may be substantially the same as steps (14) to step (16) in the aforementioned embodiment, structures of the semiconductor layer, the first conductive layer and the second conductive layer may be substantially the same as those in the aforementioned embodiment, as shown in FIG. 21.

(25) A pattern of a fourth insulation layer is formed. In an exemplary embodiment, the process of forming the pattern of the fourth insulation layer may be substantially the same as step (17) in the aforementioned embodiment, and the fourth insulation layer is provided with a plurality of vias, as shown in FIG. 22.

In an exemplary implementation, the plurality of vias of each circuit unit in the display region include, at least, a first via V1 to an eighth via V8, and a second lap via V4, wherein structures of the first via V1 to the eighth via V8 are substantially the same as those in the aforementioned embodiment.

In an exemplary implementation, an orthographic projection of the second lap via DV2 on the base substrate is within a range of an orthographic projection of a second end of the second sub-line 80-2 on the base substrate, the fourth insulation layer, the third insulation layer, the second insulation layer and the first insulation layer in the second lap via DV2 is etched away to expose a surface of a second end of the second sub-line 80-2, and the second lap via DV2 is configured such that the data signal line formed subsequently is connected with the second end of the second sub-line 80-2 through the via DV2.

In an exemplary implementation, there is a second distance L2 between an edge of the second lap via DV2 on the side close to the first sub-line 80-1 and the edge of the first sub-line 80-1 on the side close to the second lap via DV2, wherein the second distance L2 may be about 0.2 M2 to 1.2 M2, and M2 is the length of the circuit unit in the second direction Y.

In an exemplary implementation, the second distance L2 may be about 6 μm to 70 μm. For example, the second distance L2 may be about 63 μm.

(26) A pattern of a third conductive layer is formed. In an exemplary implementation, the process of forming the pattern of the third conductive layer may be substantially the same as step (18) in the aforementioned embodiment, as shown in FIG. 23.

In an exemplary implementation, the third conductive layer of each circuit unit in the display region includes, at least, a first connection electrode 41, a second connection electrode 42, a third connection electrode 43, a first power supply line 44, and a data signal line 60. Structures of the first connection electrode 41, the second connection electrode 42, the third connection electrode 43 and the first power supply line 44 are substantially the same as those in the aforementioned embodiment.

In an exemplary implementation, the data signal line 60 may be of a straight line shape in which a main part extends along the second direction Y. On one hand, the data signal line 60 is connected with a first region of the fourth active layer through the fifth via V5, such that a data signal is written to the first electrode of the fourth transistor T4. On the other hand, the data signal line 60 is connected with the second end of the second sub-line 80-2 through the second lap via DV2.

In an exemplary implementation, the orthographic projection of the data signal line 60 on the base substrate is at least partially overlapped with the orthographic projection of the second sub-line 80-2 on the base substrate.

The display substrate in the exemplary embodiment of the present disclosure can achieve the technical effect in the aforementioned embodiment, including data trace in the display region, the reduced width of the lower bezel, the effectively reduced depth of the first lap via, avoiding black spot failure in the reliability test, the improved water and oxygen isolation ability of the inner wall of the first lap via, and minimizing the bending radius of the bending region. In addition, by disposing the first lap via and the second lap via in the display region, ample space in the base substrate conductive layer is fully used for wiring, thereby reducing the width of the lead region, which is beneficial for narrowing the lower bezel.

A study shows that water and oxygen may invade the first lap via along the second flexible layer and the shielding conductive layer, and then invade from the first lap via to the second lap via. According to the present disclosure, by setting the first distance and the second distance between the first lap via and the second lap via, the path of water and oxygen intrusion is effectively increased, thereby reducing the probability of water and oxygen intrusion, and prolonging the working life of the display device.

FIG. 24 is a schematic diagram of a structure of still another data connection line according to an exemplary embodiment of the present disclosure, and is a cross-sectional view taken along the direction A-A in FIG. 7a. As shown in FIG. 24, in an exemplary implementation, a main structure of the data connection line in the exemplary embodiment is substantially the same as that of the aforementioned embodiment, except that the inner wall of the first lap via includes only the second barrier layer 10D of the inorganic material.

In an exemplary implementation, the first lap via may include a sleeved first lap sub-hole DV11 and a second lap sub-hole DV12. The first lap sub-hole DV11 is disposed on the second flexible layer 10C, the second flexible layer 10C in the first lap sub-hole DV11 is removed to expose the surface of the first connection line 70, and the inner wall of the first lap sub-hole DV11 includes only the second flexible layer. The second lap sub-hole DV12 is disposed on the second barrier layer 10D, and the second barrier layer 10D in the second lap sub-hole DV12 is removed to expose the surface of the first connection line 70, and the second barrier layer 10D completely covers the inner wall of the first overlapping sub-hole DV11. In an exemplary implementation, an orthographic projection of the second lap sub-hole DV12 on the base substrate may be within a range of an orthographic projection of the first lap sub-hole DV11 on the base substrate, i.e., the second lap sub-hole DV12 is sleeved within the first lap sub-hole DV11 to constitute the first lap sub-hole of the sleeved structure.

In an exemplary implementation, the second barrier layer 10D completely covers the inner wall of the first lap sub-hole DV11, meanwhile covering a part of the bottom wall of the first lap sub-hole DV11. That is, the exposed surface of the first connection line 70 in the first lap sub-hole DV11 is partially covered by the second barrier layer 10D.

In an exemplary implementation, structures of the second connection line 80 and the first to fourth insulation layers 91 to 94 in the exemplary embodiment may be substantially the same as those in the aforementioned embodiments.

In an exemplary implementation, the manufacturing process of the display substrate in the exemplary embodiment may be substantially the same as that in the aforementioned embodiments, except that after forming the second flexible layer, the second flexible layer is patterned at first by a patterning process to form a first lap sub-hole DV11, then a second barrier thin film is deposited such that the second barrier thin film completely covers the inner wall and the bottom wall of the first lap sub-hole DV11, and then a second barrier layer covering the bottom wall of the first lap sub-hole DV11 is patterned by a patterning process to form a second lap sub-hole DV12 in the first lap sub-hole DV11, thereby forming a first lap sub-hole of a sleeve structure.

The display substrate in the exemplary embodiment of the present disclosure can achieve the technical effect in the aforementioned embodiment, including data trace in the display region, the reduced the width of the lower bezel, the effectively reduced depth of the first lap via, avoiding black spot failure in the reliability test, the improved water and oxygen isolation ability of the inner wall of the first lap via, and reducing the bending radius of the bending region to the greatest extent. In addition, by forming a first lap sub-hole on the second flexible layer at first, then the second barrier layer covering the inner wall of the first lap sub-hole to wrap the second flexible layer, the inorganic layer is used to protect the inner wall of the organic material, which not only reduces the possibility of the invasion of water and oxygen to prevent the second flexible layer of the organic material from water and oxygen invading, but also ensures the reliability of the display apparatus, and improves the display quality and working life of the display apparatus.

FIG. 25 is a schematic diagram of a structure of still another data connection line according to an exemplary embodiment of the present disclosure, and is a cross-sectional view taken along the direction B-B in FIG. 7a. As shown in FIG. 25, in an exemplary embodiment, a main structure of the data connection line in the exemplary embodiment is substantially the same as that of the aforementioned embodiment, except that the inner wall of the first lap via is covered by the second barrier layer 10D and the edge of the first connection line 70 is wrapped by the second barrier layer 10D.

In an exemplary implementation, the first lap via may include a sleeved first lap sub-hole DV11 and a second lap sub-hole DV12. The first overlapping sub-hole DV11 is disposed on the second flexible layer 10C, the second flexible layer 10C in the first lap sub-hole DV11 is removed, and not only the surface of the first connection line 70 but also the first barrier layer 10B on both sides of the first connection line 70 are exposed, and the inner wall of the first lap sub-hole DV11 includes only the second flexible layer.

In an exemplary implementation, the second lap sub-hole DV12 is disposed on the second barrier layer 10D, and the second barrier layer 10D in the second lap sub-hole DV12 is removed, exposing the surface of the first connection line 70. In an exemplary implementation, an orthographic projection of the second lap sub-hole DV12 on the base substrate may be within a range of an orthographic projection of the first lap sub-hole DV11 on the base substrate, i.e., the second lap sub-hole DV12 is sleeved within the first lap sub-hole DV11 to constitute the first lap sub-hole of the sleeved structure.

In an exemplary embodiment, the second barrier layer 10D completely covers the inner wall of the first lap sub-hole DV11, meanwhile covering the exposed first barrier layer 10B in the first lap sub-hole DV11, and partially covering the surface of the first connection line 70, thereby forming a structure in which the first barrier layer 10B and the second barrier layer 10D wrap the edge of the first connection line 70.

In an exemplary implementation, the manufacturing process of the display substrate in the exemplary embodiment may be substantially the same as the embodiment shown in FIG. 24, except that the first lap sub-hole DV11 exposes not only the surface of the first connection line 70, but also the first barrier layer 10B on both sides of the first connection line 70.

The display substrate in the exemplary embodiment of the present disclosure can achieve the technical effect in the aforementioned embodiment, including data trace in the display region, the reduced the width of the lower bezel, the effectively reduced depth of the first lap via, avoiding black spot failure in the reliability test, the improved water and oxygen isolation ability of the inner wall of the first lap via, and reducing the bending radius of the bending region to the greatest extent. In addition, by forming a first lap sub-hole on the second flexible layer at first, then the second barrier layer covering the inner wall of the first lap sub-hole and the edge of the first connection line, the inorganic layer is used to protect the inner wall of the organic material and the first connection line of the metal material, which not only ensures the reliability of the display apparatus, but also prevents from water and oxygen invading the first connection line along the second flexible layer, avoids oxidation and corrosion of the first connection line, and improves the display quality and working life of the display apparatus.

The structure shown in the present disclosure and the manufacturing process thereof are merely exemplary description. In an exemplary implementation, corresponding structures may be changed and patterning processes may be added or reduced according to actual needs, which is not limited in the present disclosure.

In an exemplary implementation, the display substrate in the present disclosure may be applied to other display devices having pixel drive circuits, such as quantum dot displays and the like, which is not limited in the present disclosure.

The present disclosure further provides a manufacturing method for a display substrate, for manufacturing the display substrate according to the foregoing embodiments. In an exemplary implementation, the method may include acts of:

forming a base substrate, wherein the base substrate includes, at least, a first flexible layer, a second flexible layer, and a base substrate conductive layer disposed between the first flexible layer and the second flexible layer, the base substrate conductive layer includes, at least, a data connection line; and forming a drive circuit layer on the base substrate, wherein the drive circuit layer includes, at least, a shielding conductive layer disposed on the base substrate and a functional conductive layer disposed on a side of the shielding conductive layer away from the base substrate. The shielding conductive layer includes, at least, a second connection line, the functional conductive layer includes, at least, a function signal line. The second connection line is connected with the first connection line through the first lap via, and the function signal line is connected with the second connection line through the second lap via.

The present disclosure further provides a display apparatus which includes the aforementioned display substrate. The display apparatus may be any product or component with a display function, such as a mobile phone, a tablet computer, a television, a display, a laptop computer, a digital photo frame, or a navigator, and the embodiments of the present disclosure are not limited thereto.

Although the implementations disclosed in the present disclosure are described as above, the described contents are only implementations which are used for facilitating the understanding of the present disclosure, but are not intended to limit the present disclosure. Any skilled person in the art to which the present disclosure pertains may make any modifications and variations in forms and details of implementation without departing from the spirit and scope of the present disclosure. However, the patent protection scope of the present disclosure should be subject to the scope defined by the appended claims.

The invention claimed is:

1. A display substrate, comprising a drive circuit layer disposed on a base substrate that comprises, at least, a first flexible layer, a second flexible layer and a base substrate conductive layer disposed between the first flexible layer and the second flexible layer, wherein the base substrate conductive layer comprises, at least, a first connection line; the drive circuit layer at least comprises a shielding conductive layer disposed on the base substrate and a functional conductive layer disposed on a side of the shielding conductive layer away from the base substrate, wherein the shielding conductive layer at least comprises a second connection line, and the functional conductive layer comprises, at least, a function signal line; the second connection line is connected with the first connection line through a first lap via, and the function signal line is connected with the second connection line through a second lap via, wherein the display substrate comprises a display region and a bonding region disposed on a side of the display region; the display region comprises, at least, a plurality of circuit units, the bonding region comprises, at least, a lead region and a bending region disposed sequentially in a direction away from the display region, the first lap via is disposed in the lead region, and the second lap via is disposed in the display region.

2. The display substrate of claim 1, wherein in a direction parallel to the display substrate, the drive circuit layer comprises a plurality of circuit units, and at least one of the circuit units comprises a pixel drive circuit that is connected with the function signal line.

3. The display substrate of claim 2, wherein the function signal line comprises a data signal line that provides a data signal to the pixel drive circuit.

4. The display substrate of claim 2, wherein the function signal line comprises a first power supply line that provides a power supply signal to the pixel drive circuit.

5. The display substrate of claim 1, wherein the drive circuit layer comprises, at least, the shielding conductive layer, a first insulation layer, a semiconductor layer, a second insulation layer, a first conductive layer, a third insulation layer, a second conductive layer, a fourth insulation layer and a third conductive layer, wherein the functional conductive layer comprises the third conductive layer.

6. The display substrate of claim 5, wherein in a region where the first lap via is located, a plurality of inorganic layers are disposed on a side of the second connection line away from the base substrate, and the plurality of inorganic layers comprise any one or more of the first insulation layer, the second insulation layer, the third insulation layer and the fourth insulation layer.

7. The display substrate of claim 1, wherein the base substrate further comprises a first barrier layer disposed between the first flexible layer and the base substrate conductive layer, and a second barrier layer disposed on a side of the second flexible layer away from the first flexible layer.

8. The display substrate of claim 7, wherein the first lap via is provided on the second flexible layer and the second barrier layer, an inner wall of the first lap via comprises the second flexible layer and the second barrier layer, and the second connection line covers the inner wall of the first lap via.

9. The display substrate of claim 7, wherein, the first lap via comprises a first lap sub-hole and a second lap sub-hole, wherein the first lap sub-hole is disposed on the second flexible layer, an inner wall of the first lap sub-hole comprises the second flexible layer, the second barrier layer covers the inner wall of the first lap sub-hole, the second lap sub-hole is disposed on the second barrier layer, an inner wall of the second lap sub-hole comprises the second barrier layer, and the second connection line covers the inner wall of the second lap sub-hole.

10. The display substrate of claim 9, wherein the first lap sub-hole exposes a surface of the first connection line and a partial surface of the first barrier layer, and the second barrier layer covers the inner wall of the first lap sub-hole and a surface of the first barrier layer exposed by the first lap sub-hole.

11. The display substrate of claim 1, wherein the lead region comprises an encapsulated region and a non-encapsulated region that are sequentially disposed in a direction away from the display region, and the first lap via is disposed in the non-encapsulated region.

12. The display substrate of claim 1, wherein a base substrate of the bending region comprises a first flexible layer, a first barrier layer, a base substrate conductive layer, and a second flexible layer.

13. A display substrate, comprising a drive circuit layer disposed on a base substrate that comprises, at least, a first flexible layer, a second flexible layer and a base substrate conductive layer disposed between the first flexible layer and the second flexible layer, wherein the base substrate conductive layer comprises, at least, a first connection line; the drive circuit layer at least comprises a shielding conductive layer disposed on the base substrate and a functional conductive layer disposed on a side of the shielding conductive layer away from the base substrate, wherein the shielding conductive layer at least comprises a second connection line, and the functional conductive layer comprises, at least, a function signal line; the second connection line is connected with the first connection line through a first lap via, and the function signal line is connected with the second connection line through a second lap via, wherein the display substrate comprises a display region and a bonding region disposed on a side of the display region; the display region comprises, at least, a plurality of circuit units, at least one of the plurality of circuit units comprises, at least, a pixel drive circuit that is connected with a data signal line configured to provide a data signal to the pixel drive circuit; the bonding region comprises, at least, a lead region and a bending region disposed sequentially in a direction away from the display region, the first lap via and the second lap via are disposed in the display region.

14. The display substrate of claim 13, wherein the second connection line comprises, at least, a connection block, a first sub-line and a second sub-line, wherein the connection block is connected with the first connection line through the first lap via, a first end of the first sub-line is connected with the connection block, a second end of the first sub-line is connected with a first end of the second sub-line after extending in an opposite direction of the first direction, and a second end of the second sub-line is connected with the function signal line through the second lap via after extending in an opposite direction of the second direction.

15. The display substrate of claim 14, wherein a first distance between an edge of the first lap via on a side close to the second sub-line and an edge of the second sub-line on a side close to the first lap via, the first distance is 0.1 M1 to 0.5 M1, and M1 is a length of the circuit unit in the first direction.

16. The display substrate of claim 15, wherein the first distance is 6 μm to 30 μm.

17. The display substrate of claim 14, wherein a second distance between an edge of the second lap via on a side close to the first sub-line and an edge of the first sub-line on a side close to the second lap via is 0.2 M2 to 1.2 M2, wherein M2 is a length of the circuit unit in the second direction.

18. The display substrate of claim 17, wherein the second distance is 6 μm to 70 μm.

19. A manufacturing method for a display substrate, comprising:

forming a base substrate, wherein the base substrate comprises, at least, a first flexible layer, a second flexible layer, and a base substrate conductive layer disposed between the first flexible layer and the second flexible layer, the base substrate conductive layer comprises, at least, a data connection line; and forming a drive circuit layer on the base substrate, wherein the drive circuit layer comprises, at least, a shielding conductive layer disposed on the base substrate and a functional conductive layer disposed on a side of the shielding conductive layer away from the base substrate, the shielding conductive layer comprises, at least, a second connection line, the functional conductive layer comprises, at least, a function signal line, the second connection line is connected with the first connection line through a first lap via, and the function signal line is connected with the second connection line through a second lap via, wherein the display substrate comprises a display region and a bonding region disposed on a side of the display region; the display region comprises, at least, a plurality of circuit units, the bonding region comprises, at least, a lead region and a bending region disposed sequentially in a direction away from the display region, the first lap via is disposed in the lead region, and the second lap via is disposed in the display region, or wherein the display substrate comprises a display region and a bonding region disposed on a side of the display region; the display region comprises, at least, a plurality of circuit units, at least one of the plurality of circuit units comprises, at least, a pixel drive circuit that is connected with a data signal line that provides a data signal to the pixel drive circuit; the bonding region comprises, at least, a lead region and a bending region disposed sequentially in a direction away from the display region, the first lap via and the second lap via are disposed in the display region.

\* \* \* \* \*